United States Patent
Harumoto et al.

(10) Patent No.: US 8,698,152 B2
(45) Date of Patent: Apr. 15, 2014

(54) DISPLAY PANEL AND THIN FILM TRANSISTOR SUBSTRATE

(75) Inventors: Yoshiyuki Harumoto, Osaka (JP); Yoshifumi Ohta, Osaka (JP); Yuuji Mizuno, Osaka (JP); Hinae Mizuno, legal representative, Yamato (JP); Yoshimasa Chikama, Osaka (JP); Tokuo Yoshida, Osaka (JP); Masahiko Suzuki, Osaka (JP); Okifumi Nakagawa, Osaka (JP); Yoshinobu Miyamoto, Osaka (JP); Tetsuya Yamashita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/695,837

(22) PCT Filed: Feb. 14, 2011

(86) PCT No.: PCT/JP2011/000806
§ 371 (c)(1),
(2), (4) Date: Nov. 2, 2012

(87) PCT Pub. No.: WO2011/148538
PCT Pub. Date: Dec. 1, 2011

(65) Prior Publication Data
US 2013/0056741 A1  Mar. 7, 2013

(30) Foreign Application Priority Data
May 24, 2010 (JP) .................... 2010-117987

(51) Int. Cl.
*H01L 29/04* (2006.01)
*H01L 31/036* (2006.01)
*H01L 31/0376* (2006.01)
*H01L 31/20* (2006.01)
*H01L 27/12* (2006.01)

(52) U.S. Cl.
CPC ................. *H01L 27/1214* (2013.01)
USPC .. 257/59; 257/72; 257/E29.117; 257/E29.273

(58) Field of Classification Search
CPC .............. H01L 27/1214; H01L 29/4908
USPC .......... 257/59, 60, 72, 347, E29.117, E29.273
See application file for complete search history.

(56) References Cited

U.S. PATENT DOCUMENTS

2004/0246410 A1    12/2004  Kim
2010/0117073 A1 *   5/2010  Yamazaki et al. ............ 257/43

FOREIGN PATENT DOCUMENTS

JP    01-120070 A     5/1989
JP    2005-004209 A   1/2005
JP    2009-080261 A   4/2009

OTHER PUBLICATIONS

Official Communication issued in International Patent Application No. PCT/JP2011/000806, mailed on Mar. 15, 2011.

*Primary Examiner* — Hoai V Pham
(74) *Attorney, Agent, or Firm* — Keating & Bennett, LLP

(57) ABSTRACT

A display panel (50*a*) includes a TFT substrate (20*a*) in which a plurality of TFTs (5*a*) are provided, a counter substrate (30*a*) provided to face the TFT substrate (20*a*), and a display medium layer (40) provided between the TFT substrate (20*a*) and the counter substrate (30*a*), a plurality of pixels being provided so that each of the plurality of pixels is associated with a corresponding one of the TFTs (5*a*), wherein an oxide semiconductor layer (13) is provided in each of the TFTs (5*a*) as a channel, and an ultraviolet light absorbing layer (22) having a light transmitting property is provided in each of the pixels (P) so as to overlap the oxide semiconductor layer (13).

5 Claims, 17 Drawing Sheets

FIG.4
(a) 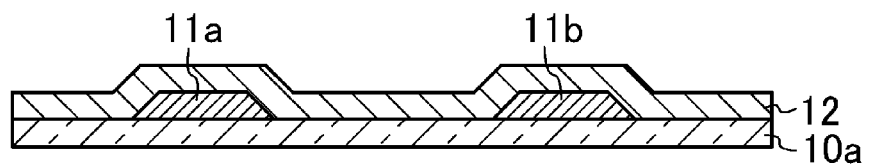
(b) 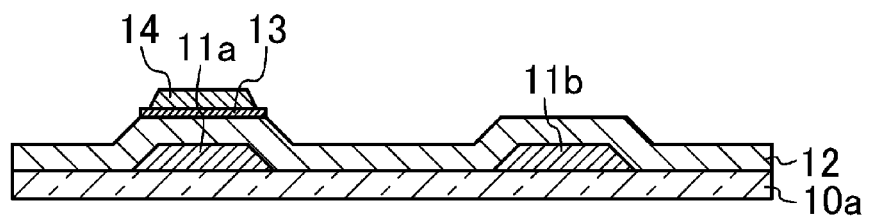
(c) 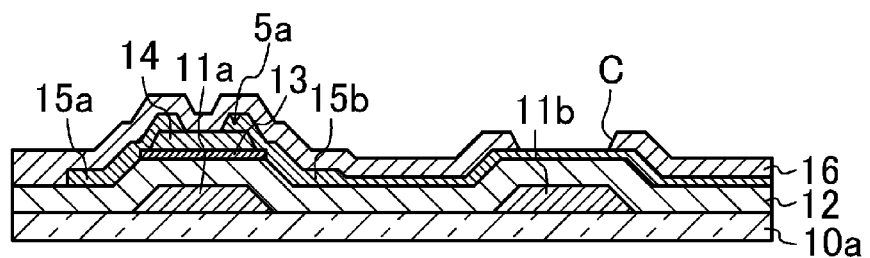
(d) 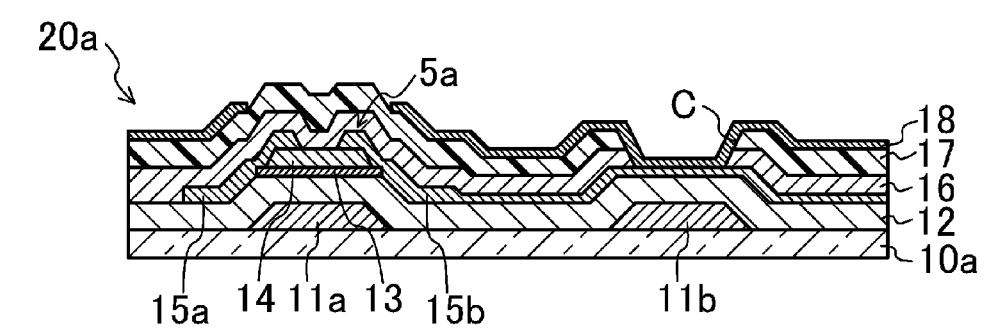

FIG.8
(a) 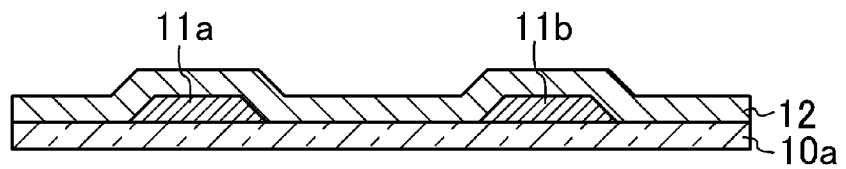
(b) 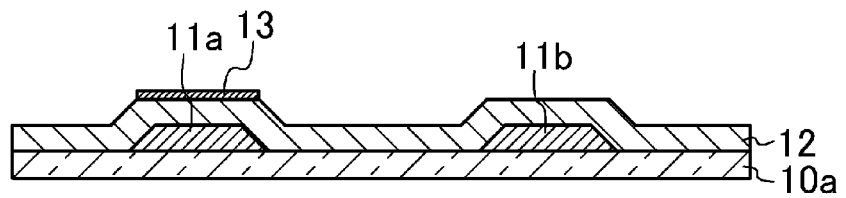
(c) 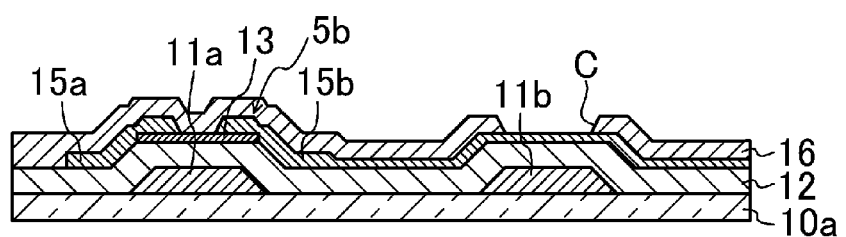
(d) 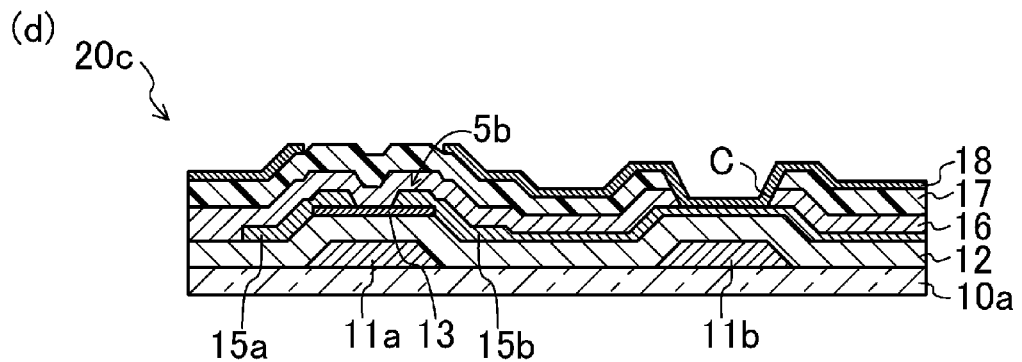

FIG.10
(a) 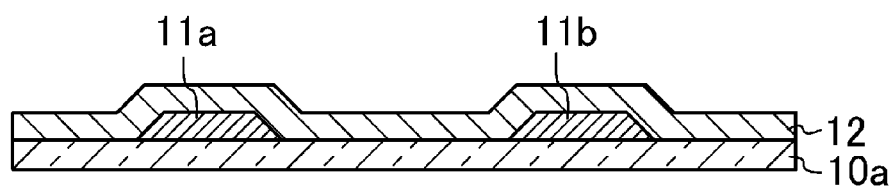
(b) 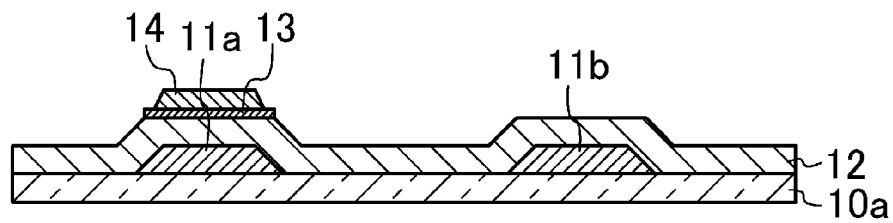
(c) 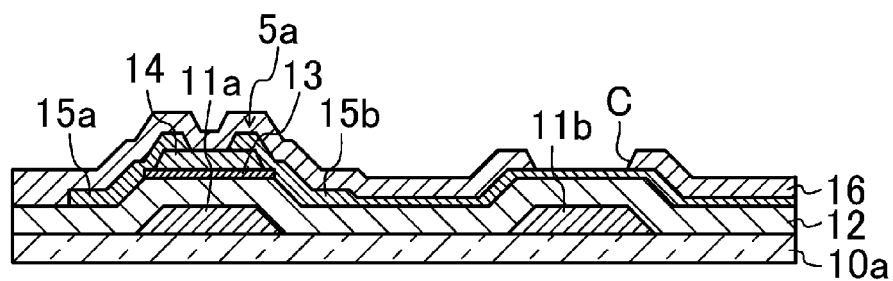
(d) 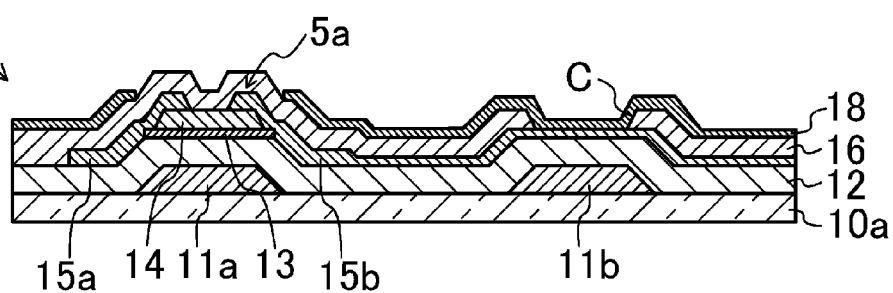

FIG.12
(a)
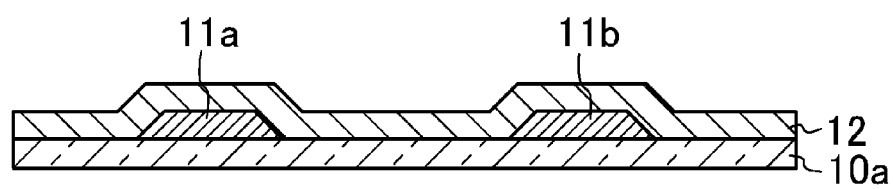
(b)
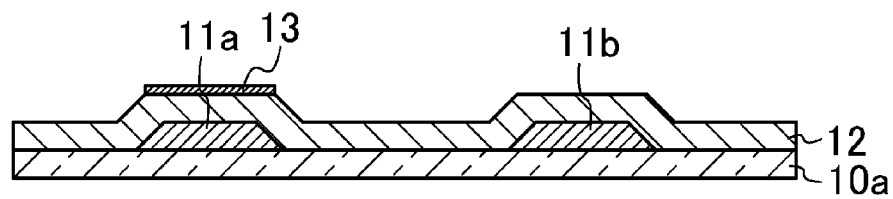
(c)
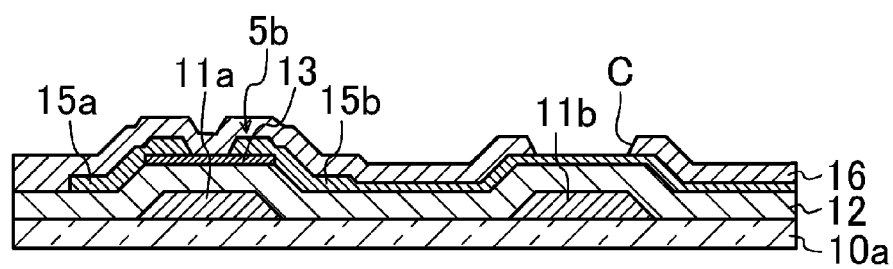
(d)
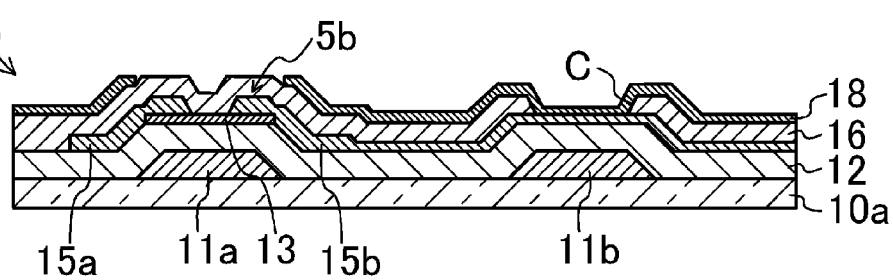

FIG.14
(a)
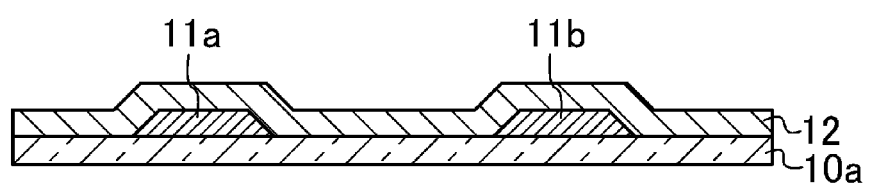
(b)
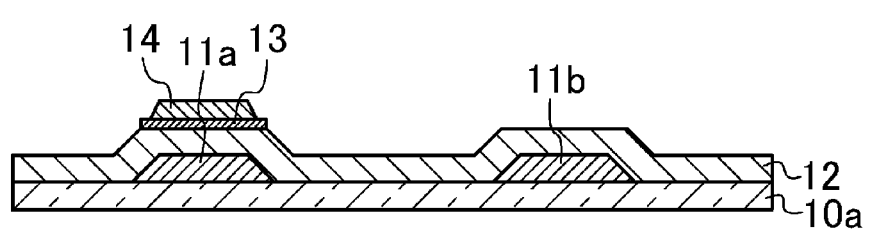
(c)
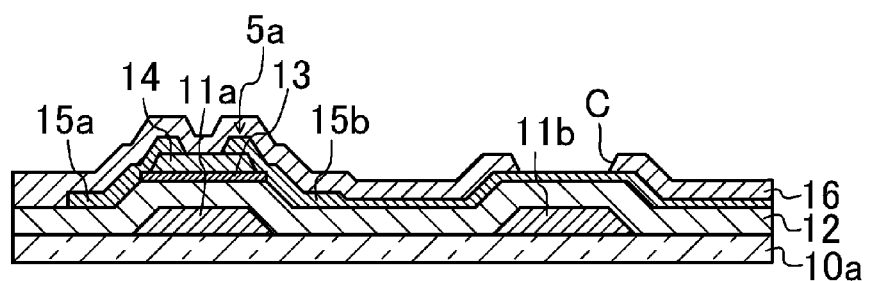
(d)
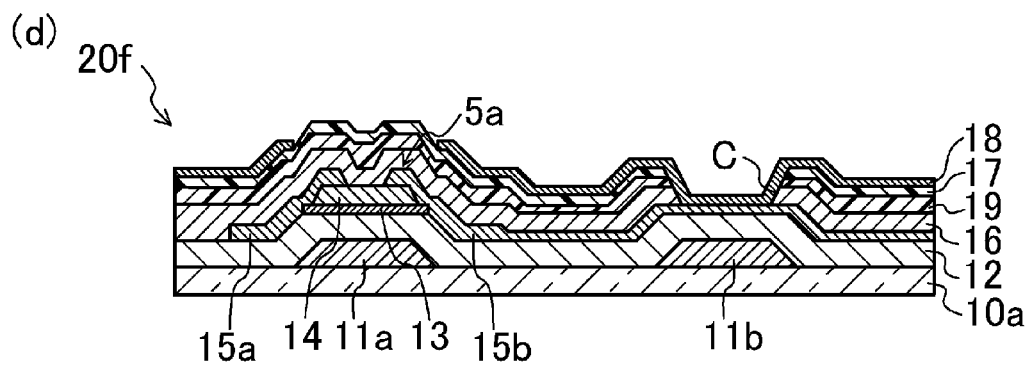

FIG.16
(a)
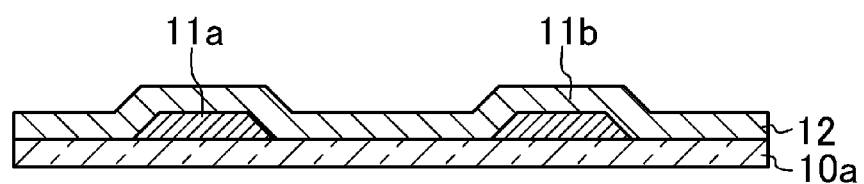
(b)
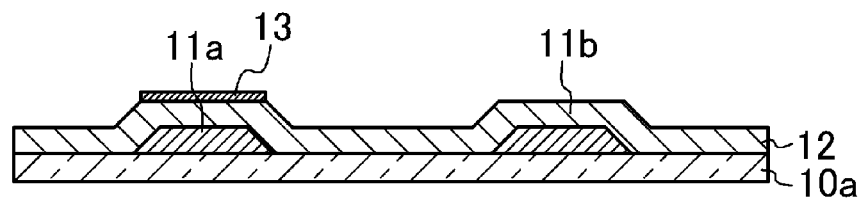
(c)
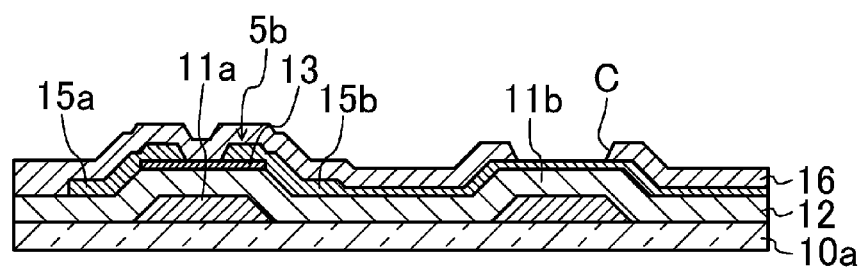
(d)
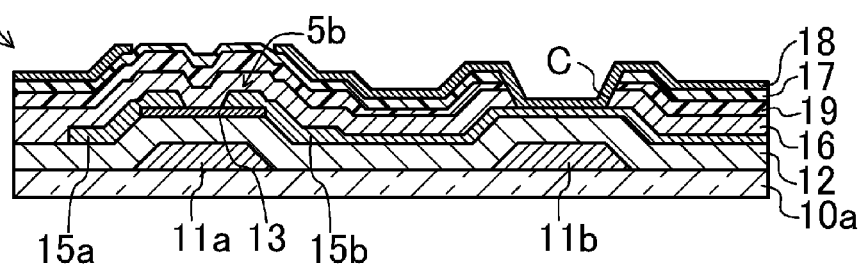

DISPLAY PANEL AND THIN FILM TRANSISTOR SUBSTRATE

TECHNICAL FIELD

The present invention relates to display panels and thin film transistor substrates.

BACKGROUND ART

A thin film transistor substrate constituting a display panel of an active matrix drive type includes a thin film transistor (hereinafter referred to as a "TFT") serving as a switching element in each pixel which is the smallest unit of an image.

A bottom gate-type TFT includes a gate electrode provided on an insulating substrate, a gate insulating film provided to cover the gate electrode, an island-shaped semiconductor layer provided on the gate insulating film to overlap the gate electrode, and a source electrode and a drain electrode provided on the semiconductor layer to overlap the gate electrode, and to be spaced from each other.

For example, Patent Document 1 discloses that, in an inverted staggered (bottom gate-type) amorphous silicon TFT, an intrinsic amorphous silicon film is altered by a plasma process, thereby improving reliability of the TFT.

CITATION LIST

Patent Document

PATENT DOCUMENT 1: Japanese Patent Publication No. H01-120070

SUMMARY OF THE INVENTION

Technical Problem

In a display panel including a TFT substrate, photocarriers are generated when light enters a channel region of the semiconductor layer of a TFT, and therefore, for example, by using a black matrix, a structure in which light does not enter the channel region of the semiconductor layer is adopted. The display panel in which the black matrix is provided causes a decrease in an aperture ratio of a pixel, and therefore, the black matrix is not preferably provided, whereby the fabrication cost can be reduced.

The present invention has been developed in view of the above problems. It is an object of the present invention to reduce generation of photocarriers without using a black matrix.

Solution To the Problem

In order to attain the above object, in the present invention, an ultraviolet light absorbing layer is provided to overlap an oxide semiconductor layer provided as a channel of a thin film transistor.

Specifically, a display panel according to the present invention includes: a thin film transistor substrate in which a plurality of thin film transistors are provided; a counter substrate provided to face the thin film transistor substrate; and a display medium layer provided between the thin film transistor substrate and the counter substrate, a plurality of pixels being provided so that each of the plurality of pixels is associated with a corresponding one of the thin film transistors, wherein an oxide semiconductor layer is provided in each of the thin film transistors as a channel, and an ultraviolet light absorbing layer having a light transmitting property is provided in each of the pixels so as to overlap the oxide semiconductor layer.

According to the above configuration, in each of the thin film transistors provided in the thin film transistor substrate, the oxide semiconductor layer is provided as a channel, and therefore, photocarriers may be generated by entry of the ultraviolet light into the oxide semiconductor layer. However, the ultraviolet light absorbing layer having a light transmitting property is provided in each of the pixels so as to overlap the oxide semiconductor layer, and therefore, the entry of the ultraviolet light into the oxide semiconductor layer is reduced, thereby reducing the generation of photocarriers. Such an ultraviolet light absorbing layer having a light transmitting property can be, for example, a colored layer (a red layer, a green layer, a blue layer, etc.) constituting a color filter which is indispensable for color display of the liquid crystal display panel, and an interlayer insulating film made of a resin. Thus, the generation of photocarriers can be reduced without using a black matrix.

The ultraviolet light absorbing layer may be provided in the thin film transistor substrate.

According to the above configuration, the ultraviolet light absorbing layer is provided in the thin film transistor substrate, and therefore, when colored layers of a color filter are employed as the ultraviolet light absorbing layer, the thin film transistor substrate specifically has a so-called color filter on array structure.

The ultraviolet light absorbing layer may be part of a colored layer provided in each of the plurality of pixels.

According to the above configuration, the ultraviolet light absorbing layer is part of the colored layer provided in each of the plurality of pixels, and therefore, an advantage of the present invention is specifically achieved. FIG. 17 is a graph showing spectral characteristics of a color filter (RGB). As can be seen from FIG. 17, each of a colored layer colored with red (R) (a red layer), a colored layer colored with green (G) (a green layer), and a colored layer colored with red (B) (a blue layer) has a transmittance of approximately 0% to 30% in a wavelength 400 nm, and therefore, the red layer, the green layer, and the blue layer would absorb light in an ultraviolet region (until 400 nm) without transmitting the light, and the colored layers each provided in each of the pixels specifically function as the ultraviolet light absorbing layer.

Each of the plurality of pixels may have a colored layer colored with one selected from at least three colors of red, green, or blue, and in each of the plurality of pixels having the colored layer colored with the red or the green, the ultraviolet light absorbing layer may be part of the colored layer colored with the red or the green, and in each of the plurality of pixels having the colored layer colored with the blue, the colored layer colored with the blue may not be disposed in a portion overlapping the oxide semiconductor layer, and the colored layer colored with the red or the green may be disposed in the portion overlapping the oxide semiconductor layer as the ultraviolet light absorbing layer.

According to the above configuration, although the colored layer colored with the blue may not sufficiently absorb ultraviolet light, in the pixel in which the colored layer colored with the blue is provided, the colored layer colored with red or green, not the colored layer colored with blue, is provided in the portion overlapping the oxide semiconductor layer, and therefore, the entry of the ultraviolet light into the oxide semiconductor layer is efficiently reduced, thereby reducing the generation of photocarriers.

The oxide semiconductor layer may include at least one of In, Ga, or Zn.

According to the above configuration, the oxide semiconductor layer includes at least one of In, Ga, or Zn, and therefore, the oxide semiconductor layer absorb ultraviolet light, whereby photocarriers may be generated. However, the ultraviolet light absorbing layer is provided so as to overlap the oxide semiconductor layer, and the entry of the ultraviolet light into the oxide semiconductor layer is reduced, thereby specifically achieving the advantage of the present invention. FIGS. 18 and 19 are graphs showing spectral characteristics (transmittance and reflectance) of an In—Ga—Zn—O based oxide semiconductor layer ($InGaZnO_4$). As can be seen from FIGS. 18 and 19, the oxide semiconductor layer of $InGaZnO_4$ has a transmittance of approximately 0% and a reflectance of 10%-20% in an ultraviolet region having a wavelength of 300 nm or less, and therefore, absorption of ultraviolet light would generate photocarriers. The oxide semiconductor layer including at least one of In, Ga, or Zn has spectral characteristics similar to those in FIGS. 18 and 19.

The thin film transistor substrate according to the present invention in which a plurality of the thin film transistors are provided, and a plurality of pixels are provided so that each of the plurality of pixels is associated with a corresponding one of the thin film transistors is characterized in that an oxide semiconductor layer is provided in each of the thin film transistors as a channel, and an ultraviolet light absorbing layer having a light transmitting property is provided in each of the pixels so as to overlap the oxide semiconductor layer.

According to the above configuration, the oxide semiconductor layer is provided as a channel in each of the thin film transistors provided in the thin film transistor substrate, and therefore, photocarriers may be generated by entry of the ultraviolet light into the oxide semiconductor layer. However, the ultraviolet light absorbing layer having a light transmitting property is provided in each of the pixels so as to overlap the oxide semiconductor layer, and therefore, the entry of the ultraviolet light into the oxide semiconductor layer is reduced, thereby reducing the generation of photocarriers. Such an ultraviolet light absorbing layer having a light transmitting property can be, for example, a colored layer (such as a red layer, a green layer, a blue layer, etc.) constituting a color filter which is indispensable for color display of the liquid crystal display panel, and an interlayer insulating film made of a resin. Thus, the generation of photocarriers can be reduced without using a black matrix.

The ultraviolet light absorbing layer may be part of a colored layer provided in each of the plurality of pixels.

According to the above configuration, the ultraviolet light absorbing layer is part of the colored layer provided in each of the plurality of pixels, and therefore, the advantage of the present invention is specifically achieved in the thin film transistor substrate having a so-called color filter on array structure.

Advantages of the Invention

According to the present invention, the ultraviolet light absorbing layer having a light transmitting property is provided in each of the pixels so as to overlap the oxide semiconductor layer provided as a channel of the thin film transistor, and therefore, generation of photocarriers can be reduced without using a black matrix.

BRIEF DESCRIPTION OF THE DRAWINGS

FIG. 4 shows cross-sectional views illustrating a method of fabricating the TFT substrate according to the first embodiment.

FIG. 8 shows cross-sectional views illustrating a method of fabricating a TFT substrate constituting the liquid crystal display panel according to the third embodiment.

FIG. 10 shows cross-sectional views illustrating a method of fabricating a TFT substrate constituting the liquid crystal display panel according to the fourth embodiment.

FIG. 12 shows cross-sectional views illustrating a method of fabricating a TFT substrate constituting the liquid crystal display panel according to the fifth embodiment.

FIG. 14 shows cross-sectional views illustrating a method of fabricating a TFT substrate constituting the liquid crystal display panel according to the sixth embodiment.

FIG. 16 shows cross-sectional views illustrating a method of fabricating a TFT substrate constituting the liquid crystal display panel according to the seventh embodiment.

DESCRIPTION OF EMBODIMENTS

Embodiments of the present invention will be described in detail hereinafter with reference to the drawings. The present invention is not limited to the following embodiments.

<<First Embodiment of the Invention>>

Figure 1:
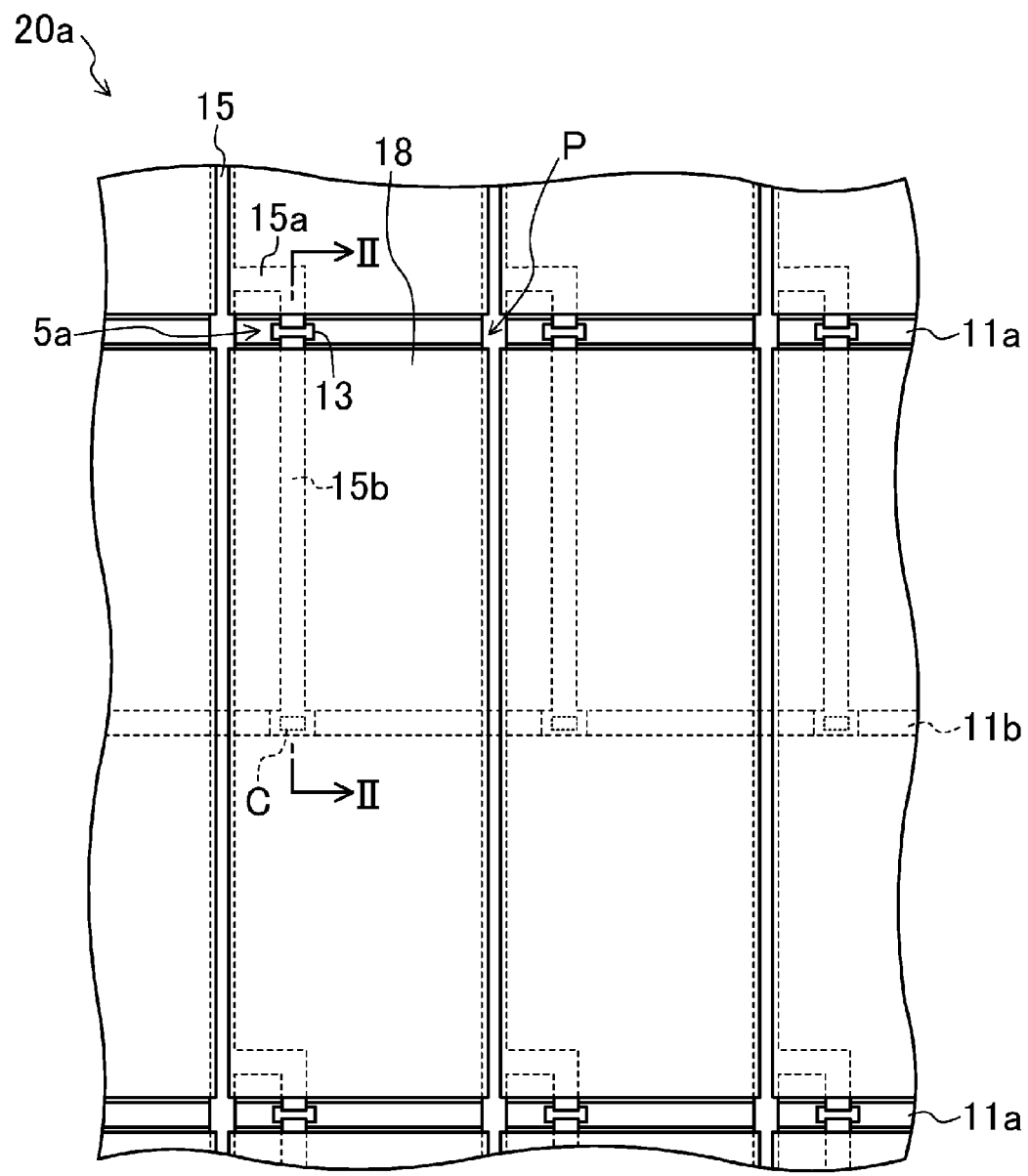
FIG. 1 is a plan view of a TFT substrate according to a first embodiment.
Figure 2:
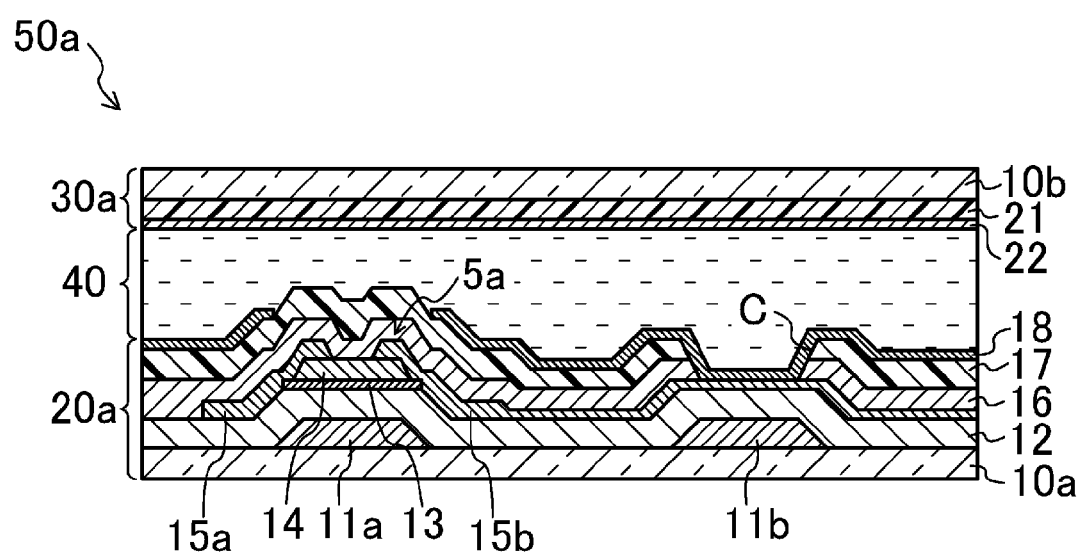
FIG. 2 is a cross-sectional view of the TFT substrate taken along the line II-II of FIG. 1 and a liquid crystal display panel including the TFT substrate.
Figure 3:
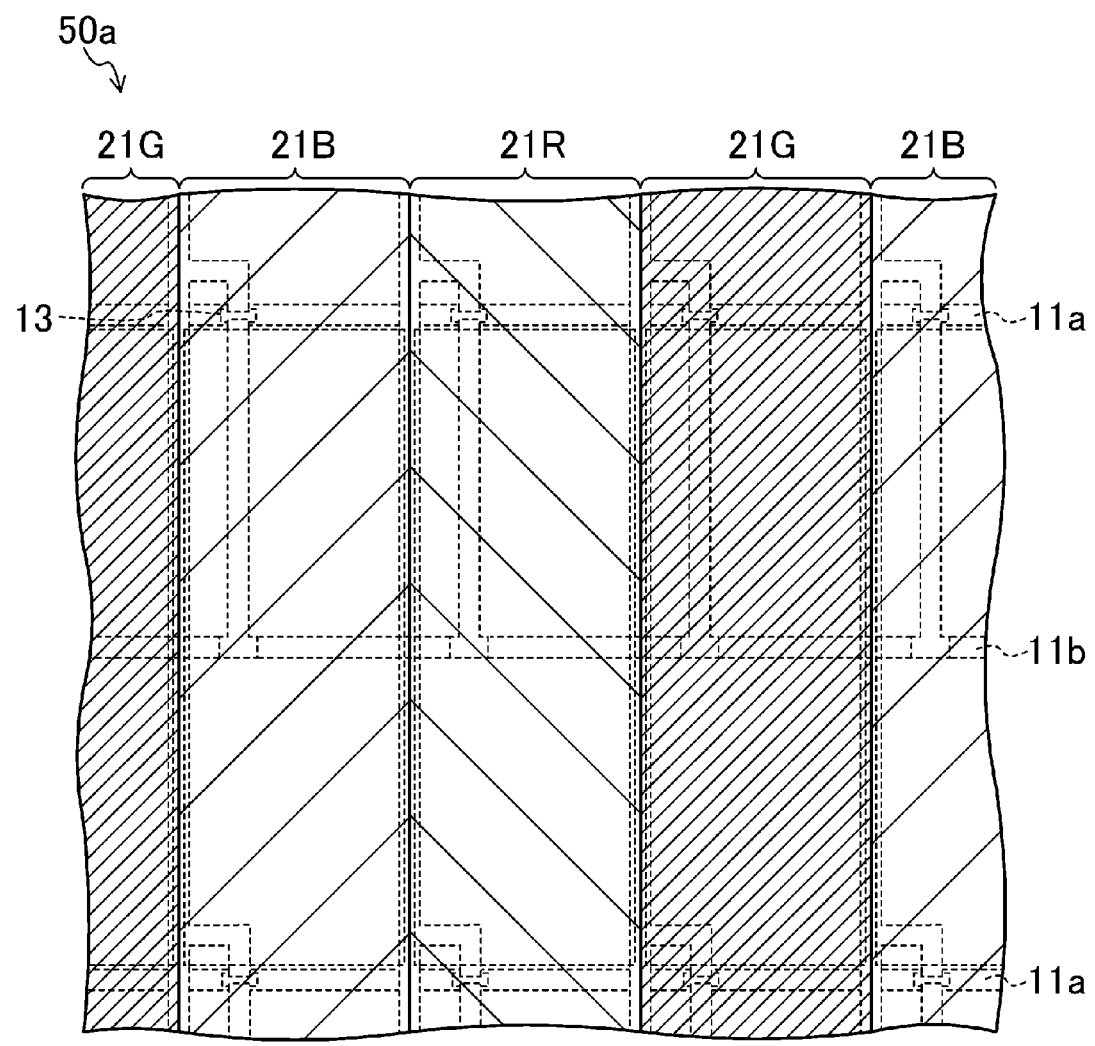
FIG. 3 is a plan view of the liquid crystal display panel according to the first embodiment.

FIGS. 1-4 show a first embodiment of a display panel and a TFT substrate according to the present invention. Specifically, FIG. 1 is a plan view of a thin film transistor substrate 20a according to the first embodiment. FIG. 2 is a cross-sectional view of the TFT substrate 20a taken along the line II-II of FIG. 1 and a liquid crystal display panel 50a including the TFT substrate 20a. FIG. 3 is a plan view of the liquid crystal display panel 50a.

The liquid crystal display panel 50 includes, as shown in FIG. 2, the TFT substrate 20a and a counter substrate 30a provided to face each other, a liquid crystal layer 40 provided between the TFT substrate 20a and the counter substrate 30a as a display medium layer, and a frame-shaped sealing material (not shown) provided to bond the TFT substrate 20a and the counter substrate 30a together, and enclose the liquid crystal layer 40 between the TFT substrate 20a and the counter substrate 30a.

The TFT substrate 20a includes, as shown in FIGS. 1 and 2, an insulating substrate 10a, a plurality of gate lines 11a provided on the insulating substrate 10a to extend in parallel to each other, a plurality of capacitor lines 11b each provided between two of the gate lines 11a to extend in parallel to each other, a plurality of source lines 15 provided to extend in parallel to each other along a direction perpendicular to the gate lines 11a, a plurality of TFTs 5a each provided at each of interconnection portions between the gate lines 11a and the source lines 15 (one TFT 5a is provided for each of pixels P), a protective film 16 provided to cover the respective TFTs 5a, an interlayer insulating film 17 provided on the protective film 16, a plurality of pixel electrodes 18 arranged in a matrix pattern on the interlayer insulating film 17, and an alignment film (not shown) provided to cover the respective pixel electrodes 18.

Figure 18:
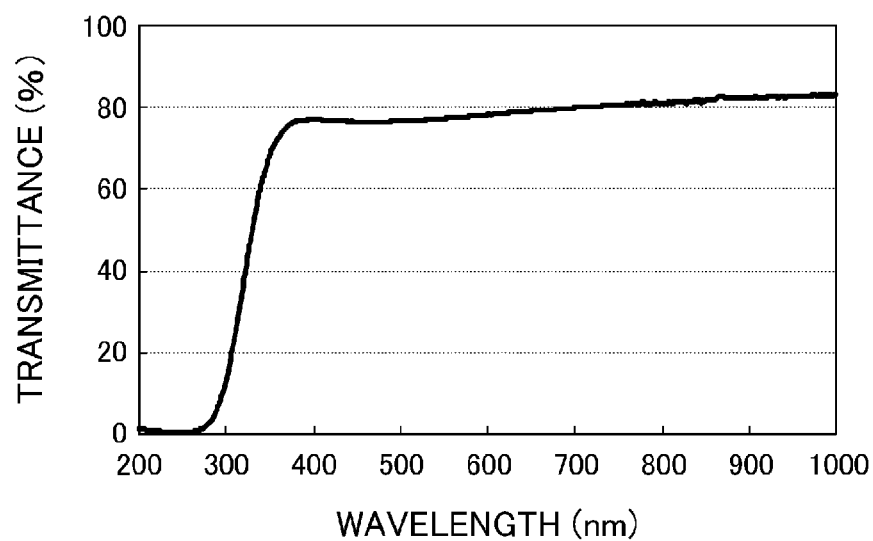
FIG. 18 is a graph showing spectral characteristics (transmittance) of an oxide semiconductor layer.
Figure 19:
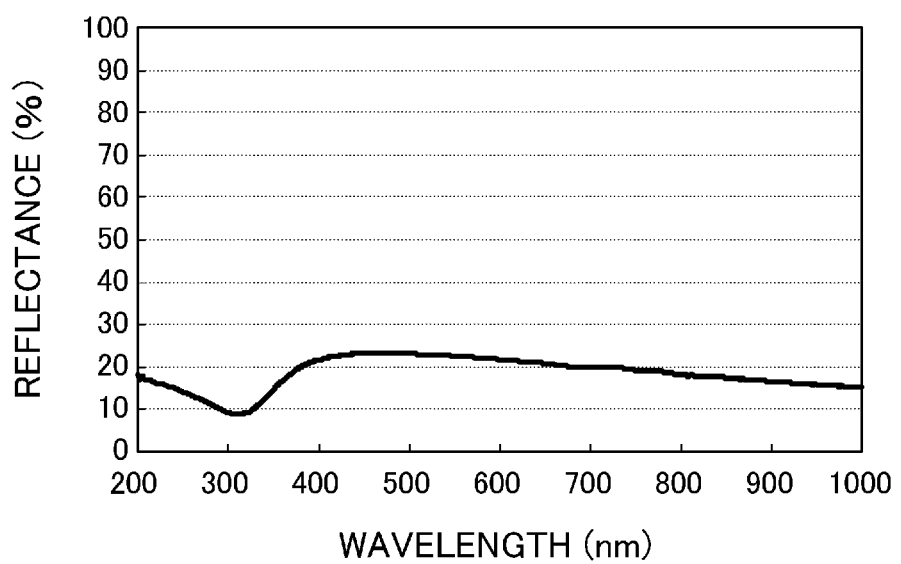
FIG. 19 is a graph showing spectral characteristics (reflectance) of the oxide semiconductor layer.

Each of the TFTs 5a includes, as shown in FIGS. 1 and 2, a gate electrode (11a) provided on the insulating substrate 10a, a gate insulating film 12 provided to cover the gate electrode (11a), an island-shaped oxide semiconductor layer 13 provided on the gate insulating film 12 to overlap the gate electrode (11a) as a channel, a channel protective layer 14 provided to cover the channel region of the oxide semiconductor layer 13, and a source electrode 15a and a drain electrode 15b provided on the oxide semiconductor layer 13 through the channel protective layer 14 to overlap the gate electrode (11a) and face each other. The gate electrode (11a) is part of the gate lines 11a, as shown in FIG. 1. The source electrode 15a is a laterally protruding, L-shaped part of the source line 15, as shown in FIG. 1. Moreover, the drain electrode 15b is connected to the pixel electrode 18 through a contact hole C formed in a stacked film of the protective film 16 and the interlayer insulating film 17, as shown in FIG. 2, and constitutes an auxiliary capacitor by overlapping the capacitor line 11b through the gate insulating film 12, as shown in FIGS. 1 and 2. The oxide semiconductor layer 13 is a semiconductor layer made of an In—Ga—Zn—O based oxide semiconductor layer, such as $InGaZnO_4$ etc. FIGS. 18 and 19 are graphs showing spectral characteristics (transmittance and reflectance) of the oxide semiconductor layer (In-$GaZnO_4$) used in this embodiment. As shown in FIGS. 18 and 19, the oxide semiconductor layer 13 has a transmittance of approximately 0% and a reflectance of 10%-20% in an ultraviolet region having a wavelength of 300 nm or less, and it is likely to absorb ultraviolet light.

The counter substrate 30a includes, as shown in FIGS. 2 and 3, an insulating substrate 10b, red layers 21R, green layers 21G, and blue layers 21B arranged in a stripe pattern as a colored layer 21 of each of the pixels P to extend in parallel to each other on the insulating substrate 10b, a common electrode 22 provided to cover the red layers 21R, the green layers 21G, and the blue layers 21B, and an alignment film (not shown) provided to cover the common electrode 22.

Figure 17:
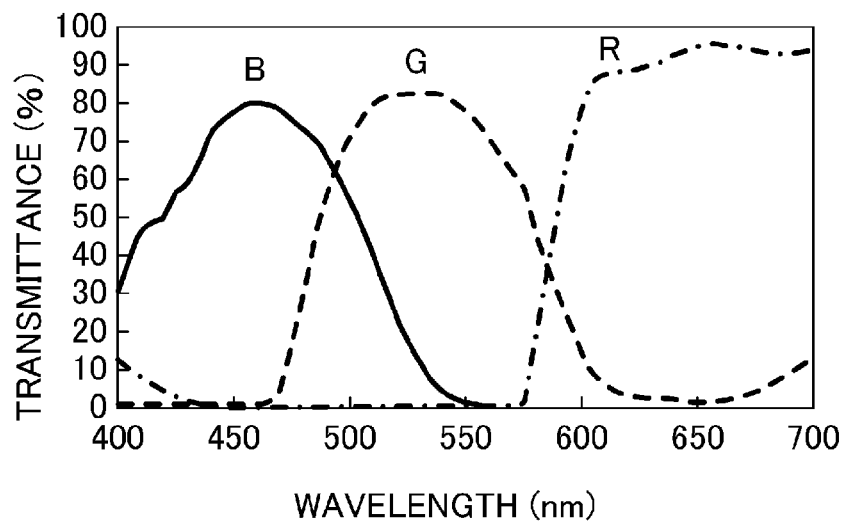
FIG. 17 is a graph showing spectral characteristics of a color filter.

The red layer 21R, the green layer 21G, and the blue layer 21B are configured to function as a color filter of each of the pixels P for performing color display, and besides, the red layers 21R, the green layers 21G, and the blue layers 21B are arranged to overlap the oxide semiconductor layer 13 of each of the pixels P, thereby allowing part of the layers to function as an ultraviolet light absorbing layer for reducing entry of ultraviolet light into the channel region of the oxide semiconductor layer 13. FIG. 17 is a graph showing spectral characteristics of the color filter (RGB) used in this embodiment. Each of the red layer 21R, the green layer 21G, and the blue layer 21B has a transmittance of approximately 0% to 30% in the wavelength of 400 nm, as shown in FIG. 17, and therefore, they are configured to mainly absorb light in the ultraviolet region (until 400 nm) without transmitting the light.

The liquid crystal layer 40 is made of, for example, a nematic liquid crystal material having electrooptical properties etc.

The liquid crystal display panel 50a having the above configuration is configured to apply a predetermined voltage to the liquid crystal layer 40 provided between the pixel electrode 18 on the TFT substrate 20a and the common electrode 22 on the counter substrate 30a in each of the pixels P to change an alignment state of the liquid crystal layer 40, thereby adjusting the transmittance of the light transmitting the panel in each of the pixels P to display an image.

Next, a method of fabricating the liquid crystal display panel 50a in this embodiment will be described with reference to FIG. 4. FIG. 4 shows cross-sectional views illustrating a method of fabricating the TFT substrate 20a according to this embodiment. The fabrication method of this embodiment includes a TFT substrate fabricating process, a counter substrate fabricating process, and a liquid crystal injecting process.

<TFT Substrate Fabricating Process>

Initially, a metal film, such as a titanium film (thickness: approximately 100 nm to 500 nm) etc., is formed by a sputtering method on the entire insulating substrate 10a, such as a glass substrate, etc., and thereafter, photolithography, wet etching or dry etching, and resist removal and cleaning are performed with respect to the metal film, thereby forming each of the gate lines 11a and the capacitor lines 11b (see FIG. 4(a)).

Subsequently, an inorganic insulating film, such as a silicon oxide film (thickness: approximately 200 nm to 500 nm) etc., is formed by a CVD (Chemical Vapor Deposition) method on the entire substrate on which the gate lines 11a and the capacitor lines 11b have been formed, thereby forming the gate insulating film 12, as shown in FIG. 4(a).

Moreover, an amorphous oxide semiconductor film (thickness: approximately 20 nm to 200 nm), such as an In—Ga—Zn—O based oxide semiconductor film etc., is formed by a sputtering method on the entire substrate on which the gate insulating film 12 has been formed, and subsequently, an inorganic insulating film, such as a silicon oxide film (thickness: approximately 50 nm to 300 nm) etc., is formed by an CVD method, and thereafter, photolithography, wet etching or dry etching, and resist removal and cleaning are performed with respect to the inorganic insulating film, thereby forming each of the channel protective layers 14, and subsequently, photolithography, wet etching, resist removal and cleaning are performed with respect to the oxide semiconductor film, thereby forming each of the oxide semiconductor layers 13, as shown in FIG. 4(b).

A metal film, such as a titanium film (thickness: approximately 100 nm to 500 nm) etc., is formed by a sputtering method on the entire substrate on which the oxide semiconductor layers 13 have been formed, and thereafter, photolithography, wet etching or dry etching, and resist removal and cleaning are performed with respect to the metal film, thereby forming each of the source lines 15, the source electrodes 15a, and the drain electrodes 15b to form each of the TFTs 5a (see FIG. 4(c)).

Subsequently, an inorganic insulating film, such as a silicon oxide film (thickness: approximately 150 nm to 500 nm) etc., is formed by, e.g., a CVD method on the entire substrate on which the TFTs 5a have been formed, and thereafter, photolithography, dry etching, and resist removal and cleaning are performed with respect to the inorganic insulating film, as shown in FIG. 4(c), thereby forming the protective film 16 in which the contact holes C are patterned. Then, an anneal treatment is performed with respect to the substrate on which the protective film 16 has been formed, thereby recovering oxygen deficiency of the oxide semiconductor layer 13, and reducing a defect level due to the oxygen deficiency.

Moreover, an acrylic photosensitive resin is coated by, e.g., a spin coating method or a slit coating method on the entire substrate on which the protective film 16 has been formed to have a thickness of approximately 2 μm, and the coated film is patterned by photolithography, thereby forming the interlayer insulating film 17 in which the contact holes C are patterned (see FIG. 4(d)).

Finally, a transparent conductive film, such as an indium tin Oxide (ITO) film (thickness: approximately 50 nm to 200 nm) etc., is formed by a sputtering method on the entire substrate on which the interlayer insulating film 17 has been formed, and thereafter, photolithography, wet etching, and resist removal and cleaning are performed with respect to the transparent conductive film, thereby forming each of the pixel electrodes 18, as shown in FIG. 4(d).

In this way, the TFT substrate 20a can be fabricated.

<Counter Substrate Fabricating Process>

Initially, a photosensitive resin colored with, e.g., red, green, or blue is coated by a spin coating method or a slit coating method on the entire insulating substrate 10a, such as a glass substrate etc., to perform pre-bake, and thereafter, exposure, development, and post-bake are performed with respect to the coated film, thereby forming the colored layer 21 having the selected color (for example, the red layer 21R) to have a thickness of approximately 2.0 μm. Subsequently, the similar processes are repeatedly performed with respect to the colored layers having the other two colors, thereby forming the colored layers 21 (for example, the green layer 21G, and the blue layer 21B) to have a thickness of approximately 2.0 μm.

Moreover, a transparent conductive film (thickness: approximately 50 nm to 200 nm), such as an ITO film etc., is formed by a sputtering method on the substrate on which the red layers 21R, the green layers 21G, and the blue layers 21B have been formed, and thereafter, photolithography, wet etching and resist removal and cleaning are performed with respect to the transparent conductive film, thereby forming the common electrode 22.

In this way, the counter substrate 30a can be fabricated.

<Liquid Crystal Injecting Process>

Initially, a polyimide resin film is coated by a printing method on each of the surface of the TFT substrate 20a which has been formed in the TFT substrate fabricating process, and the surface of the counter substrate 30a which has been formed in the counter substrate fabricating process, and thereafter, baking and rubbing treatments are performed with respect to the coated film, thereby forming the alignment film.

Moreover, a sealing material made of a thermal curing resin etc., and having a liquid crystal filing hole is printed on, for example, the surface of the counter substrate 30a on which the alignment film has been formed, and the counter substrate 30a on which the sealing material has been printed, and the TFT substrate 20a on which the alignment film has been formed are bonded together. Thereafter, the liquid crystal material is injected into the space between the both substrates by a vacuum injection method, and the liquid crystal filing hole is sealed, thereby enclosing the liquid crystal layer 40.

In this way, the liquid crystal display panel 50a in this embodiment can be fabricated.

As described above, according to the liquid crystal display panel 50a of this embodiment, since the oxide semiconductor layer 13 is provided as a channel in each of the TFTs 5a arranged in the TFT substrate 20a, photocarriers may be generated by the entry of the ultraviolet light into the oxide semiconductor layer 13. However, the red layers 21R, the green layers 21G, and the blue layers 21B are provided as an ultraviolet light absorbing layer to overlap each of the oxide semiconductor layers 13, and therefore, the entry of the ultraviolet light into the oxide semiconductor layer 13 is reduced, thereby reducing the generation of photocarriers. As the ultraviolet light absorbing layer, the red layers 21R, the green layers 21G, and the blue layers 21B can be employed which are indispensable for color display, and therefore, the generation of photocarriers can be reduced without using a black matrix. In the liquid crystal display panel 50a, since the black matrix is not provided, it is possible to improve an aperture ratio of a pixel, reduce a fabrication cost, and shorten a fabrication takt time (reduction of a takt time). Moreover, the liquid crystal display panel 50a includes the oxide semiconductor layers 13 as a channel, thereby achieving the TFTs 5a having excellent characteristics, such as high mobility, high reliability, and low off current, etc.

<<Second Embodiment of the Invention>>

Figure 5:
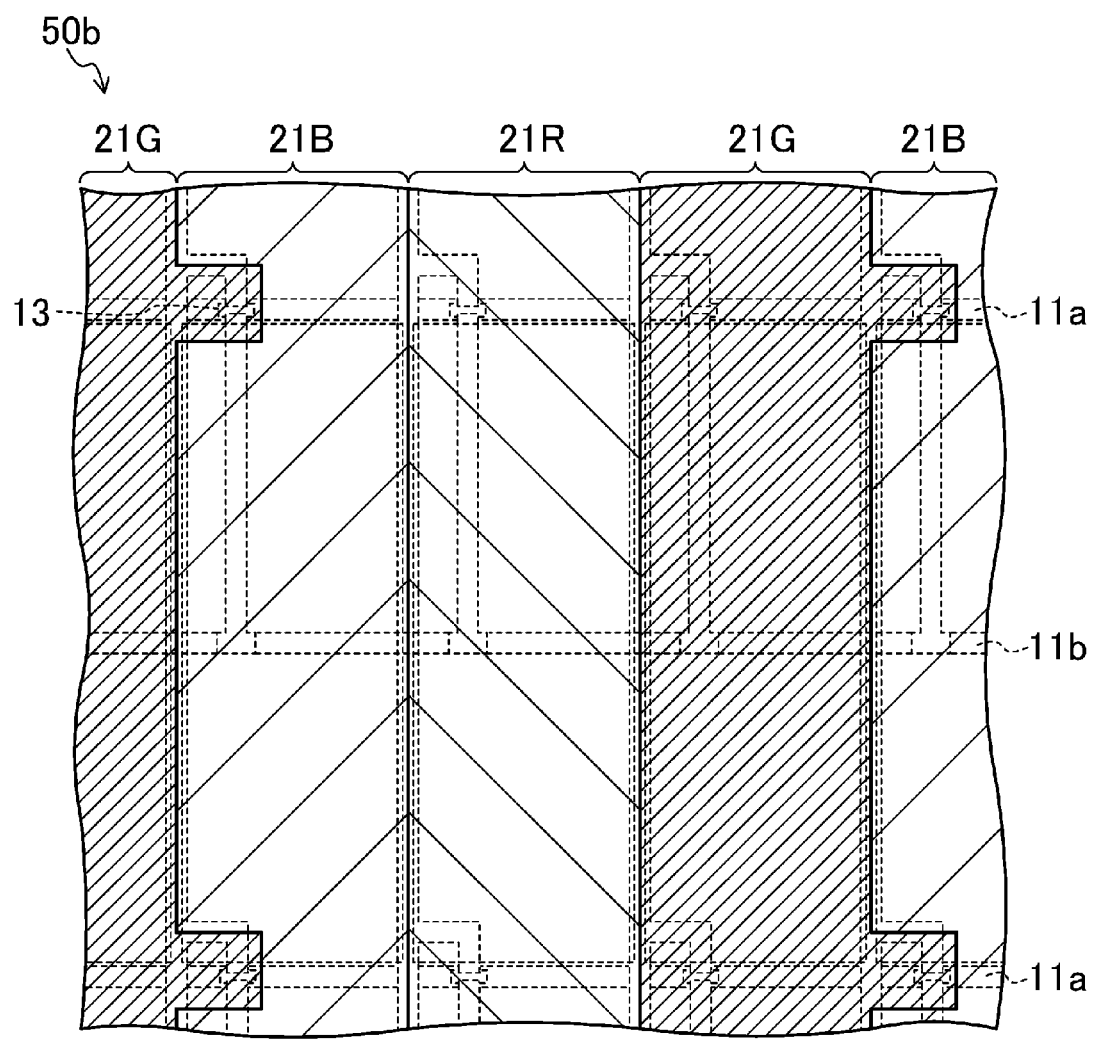
FIG. 5 is a plan view of a liquid crystal display panel according to a second embodiment.
Figure 6:
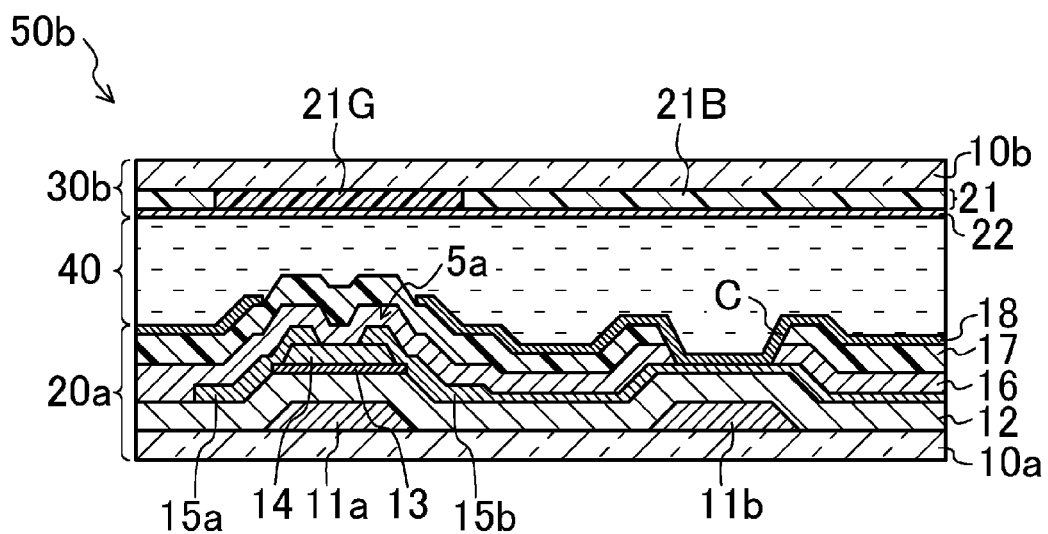
FIG. 6 is a cross-sectional view of the liquid crystal display panel according to the second embodiment.

FIG. 5 is a plan view of a liquid crystal display panel 50b in this embodiment, and FIG. 6 is a cross-sectional view of the liquid crystal display panel 50b. In the following embodiments, the same components as those shown in FIGS. 1-4 will be indicated by the same reference characters to omit detailed description thereof.

The first embodiment has illustrated the liquid crystal display panel 50a in which the red layers 21R, the green layers 21G, and the blue layers 21B arranged in the respective pixels P are used as an ultraviolet light absorbing layer. This embodiment illustrates the liquid crystal display panel 50b in which red layers 21R, and green layers 21G are used as an ultraviolet light absorbing layer.

The liquid crystal display panel 50b includes, as shown in FIG. 6, a TFT substrate 20a and a counter substrate 30b provided to face each other, a liquid crystal layer 40 provided between the TFT substrate 20a and the counter substrate 30b, and a frame-shaped sealing material (not shown) provided to bond the TFT substrate 20a and the counter substrate 30b together, and enclose the liquid crystal layer 40 between the TFT substrate 20a and the counter substrate 30b.

The counter substrate 30b includes, as shown in FIG. 6, an insulating substrate 10b, the red layers 21R, the green layers 21G, and blue layers 21B arranged in a stripe pattern as a colored layer 21 of each of the pixels P to extend in parallel to each other on the insulating substrate 10b, a common electrode 22 provided to cover the red layers 21R, the green layers 21G, and the blue layers 21B, and an alignment film (not shown) provided to cover the common electrode 22.

In each of the pixels P including the blue layer 21B, as shown in FIG. 5, the blue layer 21B is not disposed in a portion overlapping the oxide semiconductor layer 13, and a protruding portion of the green layers 21G provided in the adjoining pixel P is disposed as an ultraviolet light absorbing layer.

In each of the pixels P including the red layer 21R, and in each of the pixels P including the green layer 21G, each of part of the red layer 21R, and part of the green layer 21G functions as an ultraviolet light absorbing layer.

The liquid crystal display panel 50b having the above configuration can be fabricated if the patterns of the green layers 21G, and the blue layers 21B in the counter substrate fabricating process of the first embodiment are changed.

As described above, according to the liquid crystal display panel 50b of this embodiment, as well as the first embodiment, since the colored layer 21 is provided as an ultraviolet light absorbing layer to overlap the oxide semiconductor layer 13 provided as a channel of the TFT 5*a*, generation of photocarriers can be reduced without using a black matrix. Even if the blue layer 21B constituting the colored layer 21 does not sufficiently absorb ultraviolet light, in the pixel including the blue layer 21B, the green layer 21G, not the blue layer 21B, is disposed in the portion overlapping the oxide semiconductor layer 13, and therefore, the entry of the ultraviolet light into the oxide semiconductor layer 13 is efficiently reduced, thereby making it possible to reduce the generation of photocarriers.

This embodiment has illustrated the configuration in which the green layer 21G is disposed as the ultraviolet light absorbing layer in each of the pixels P including the blue layer 21B. In each of the pixels P including the blue layer 21B, the red layer 21R may be disposed as the ultraviolet light absorbing layer.

<<Third Embodiment of the Invention>>

Figure 7:
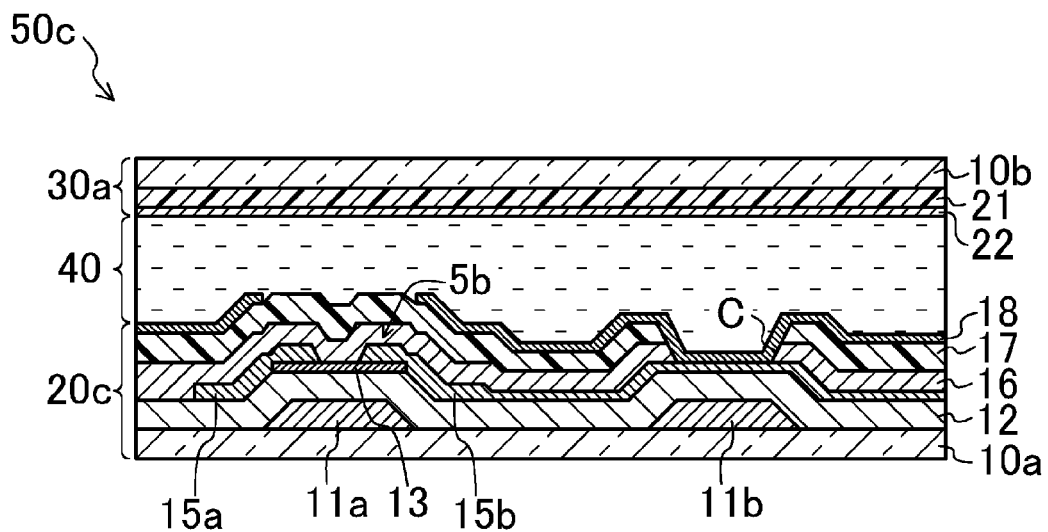
FIG. 7 is a cross-sectional view of a liquid crystal display panel according to a third embodiment.

FIG. 7 is a cross-sectional view of a liquid crystal display panel 50*c* in this embodiment, and FIG. 8 shows cross-sectional views illustrating a method of fabricating a TFT substrate 20*c* constituting the liquid crystal display panel 50*c*.

While each of the above embodiments has illustrated the liquid crystal display panels 50*a*, and 50*b* including the TFT substrate 20*a* having the channel protective layers 14, this embodiment illustrates the liquid crystal display panel 50*c* including a TFT substrate 20*c* in which a channel protective layer is not provided.

The liquid crystal display panel 50*c* includes, as shown in FIG. 7, the TFT substrate 20*c* and a counter substrate 30*a* provided to face each other, a liquid crystal layer 40 provided between the TFT substrate 20*c* and the counter substrate 30*a*, and a frame-shaped sealing material (not shown) provided to bond the TFT substrate 20*c* and the counter substrate 30*a* together, and enclose the liquid crystal layer 40 between the TFT substrate 20*c* and the counter substrate 30*a*.

In the TFT substrate 20*c*, each of TFTs 5*b* corresponding to each of the TFTs 5*a* in the above embodiment includes, as shown in FIG. 7, a gate electrode (11*a*) provided on the insulating substrate 10*a*, a gate insulating film 12 provided to cover the gate electrode (11*a*), an island-shaped oxide semiconductor layer 13 provided on the gate insulating film 12 to overlap the gate electrode (11*a*) as a channel, and a source electrode 15*a* and a drain electrode 15*b* provided on the oxide semiconductor layer 13 to overlap the gate electrode (11*a*) and face each other.

Next, a method of fabricating the TFT substrate 20*c* in this embodiment will be described with reference to FIG. 8.

Initially, a metal film, such as a titanium film (thickness: approximately 100 nm to 500 nm) etc., is formed by a sputtering method on the entire insulating substrate 10*a*, such as a glass substrate etc., and thereafter, photolithography, wet etching or dry etching, and resist removal and cleaning are performed with respect to the metal film, thereby forming each of the gate lines 11*a* and the capacitor lines 11*b* (see FIG. 8(*a*)).

Subsequently, an inorganic insulating film, such as a silicon oxide film (thickness: approximately 200 nm to 500 nm) etc., is formed by a CVD (Chemical Vapor Deposition) method on the entire substrate on which the gate lines 11*a* and the capacitor lines 11*b* have been formed, thereby forming the gate insulating film 12, as shown in FIG. 8(*a*).

Moreover, an amorphous oxide semiconductor film (thickness: approximately 20 nm to 200 nm), such as an In—Ga—Zn—O based oxide semiconductor film etc., is formed by a sputtering method on the entire substrate on which the gate insulating film 12 has been formed, and photolithography, wet etching, and resist removal and cleaning are performed with respect the oxide semiconductor film, thereby forming each of the oxide semiconductor layers 13, as shown in FIG. 8(*b*).

A metal film, such as a titanium film (thickness: approximately 100 nm to 500 nm) etc., is formed by a sputtering method on the entire substrate on which the oxide semiconductors layer 13 have been formed, and thereafter, photolithography, wet etching or dry etching, and resist removal and cleaning are performed with respect to the metal film, thereby forming each of the source lines 15, the source electrodes 15*a*, and the drain electrodes 15*b* to form each of the TFTs 5*b* (see FIG. 8(*c*)).

Subsequently, an inorganic insulating film, such as a silicon oxide film (thickness: approximately 150 nm to 500 nm) etc., is formed by, e.g., a CVD method on the substrate on which the TFTs 5*b* have been formed, and thereafter, photolithography, dry etching, and resist removal and cleaning are performed with respect to the inorganic insulating film, as shown in FIG. 8(*c*), thereby forming the protective film 16 in which contact holes C are patterned. Then, an anneal treatment is performed with respect to the substrate on which the protective film 16 has been formed, thereby recovering oxygen deficiency of the oxide semiconductor layer 13, and reducing a defect level due to the oxygen deficiency.

Moreover, an acrylic photosensitive resin is coated by, e.g., a spin coating method or a slit coating method on the entire substrate on which the protective film 16 has been formed to have a thickness of approximately 2 μm, and the coated film is patterned by photolithography, thereby forming the interlayer insulating film 17 in which the contact holes C are patterned (see FIG. 8(*d*)).

Finally, a transparent conductive film, such as an ITO film (thickness: approximately 50 nm to 200 nm) etc., is formed by a sputtering method on the entire substrate on which the interlayer insulating film 17 has been formed, and thereafter, photolithography, wet etching, and resist removal and cleaning are performed with respect to the transparent conductive film, thereby forming each of the pixel electrodes 18, as shown in FIG. 8(*d*).

In this way, the TFT substrate 20*c* can be fabricated.

As described above, according to the liquid crystal display panel 50*c* of this embodiment, as well as each of the above embodiments, since the colored layer 21 is provided as an ultraviolet light absorbing layer to overlap the oxide semiconductor layer 13 provided as a channel of the TFT 5*b*, generation of photocarriers can be reduced without using a black matrix, and since a channel protective layer is not provided on the oxide semiconductor layer 13, it is possible to reduce a fabrication cost, and shorten a fabrication takt time.

<<Fourth Embodiment of the Invention>>

Figure 9:
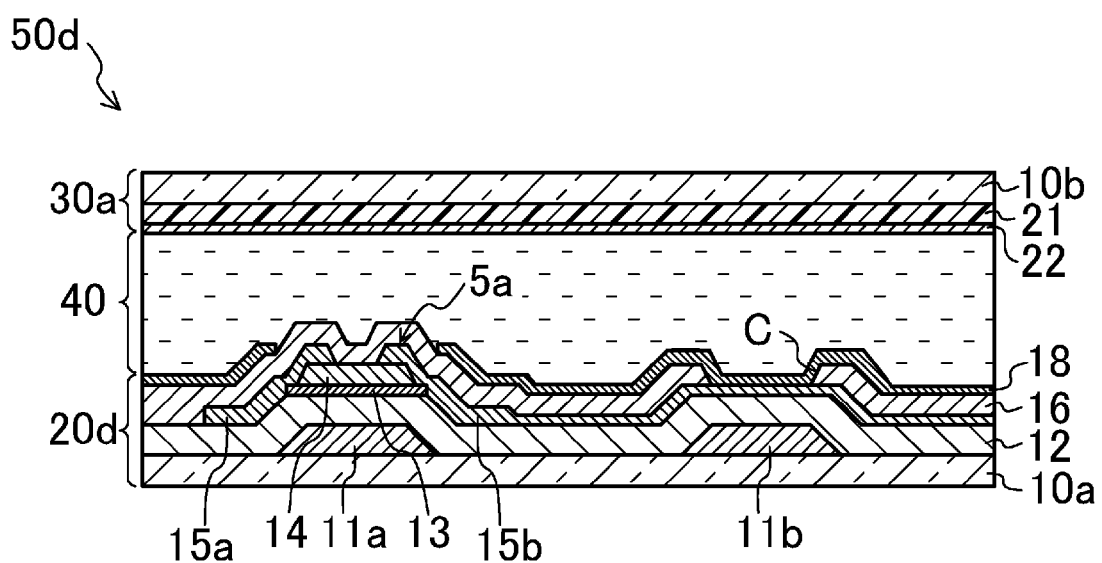
FIG. 9 is a cross-sectional view of a liquid crystal display panel according to a fourth embodiment.

FIG. 9 is a cross-sectional view of a liquid crystal display panel 50*d* in this embodiment, and FIG. 10 shows cross-sectional views illustrating a method of fabricating a TFT substrate 20*d* constituting the liquid crystal display panel 50*d*.

While each of the above embodiments has illustrated the liquid crystal display panels 50*a*-50*c* including the TFT substrate having the interlayer insulating film 17, this embodiment illustrates the liquid crystal display panel 50*d* including the TFT substrate 20*d* in which an interlayer insulating film is not provided.

The liquid crystal display panel 50*d* includes, as shown in FIG. 9, the TFT substrate 20*d* and a counter substrate 30*a* provided to face each other, a liquid crystal layer 40 provided between the TFT substrate 20*d* and the counter substrate 30*a*, and a frame-shaped sealing material (not shown) provided to bond the TFT substrate 20*d* and the counter substrate 30*a* together, and enclose the liquid crystal layer 40 between the TFT substrate 20d and the counter substrate 30a.

As shown in FIG. 9, the TFT substrate 20d includes a protective film 16 to cover each of TFTs 5a, and a plurality of pixel electrodes 18 arranged in a matrix pattern on a protective film 16.

Next, a method of fabricating the TFT substrate 20d in this embodiment will be described with reference to FIG. 10.

Initially, a metal film, such as a titanium film (thickness: approximately 100 nm to 500 nm) etc., is formed by a sputtering method on the entire insulating substrate 10a, such as a glass substrate etc., and thereafter, photolithography, wet etching or dry etching, and resist removal and cleaning are performed with respect to the metal film, thereby forming each of the gate lines 11a and the capacitor lines 11b (see FIG. 10(a)).

Subsequently, an inorganic insulating film, such as a silicon oxide film (thickness: approximately 200 nm to 500 nm) etc., is formed by a CVD (Chemical Vapor Deposition) method on the entire substrate on which the gate lines 11a and the capacitor lines 11b have been formed, thereby forming the gate insulating film 12, as shown in FIG. 10(a).

Moreover, an amorphous oxide semiconductor film (thickness: approximately 20 nm to 200 nm), such as an In—Ga—Zn—O based oxide semiconductor film etc., is formed by a sputtering method on the entire substrate on which the gate insulating film 12 has been formed, and subsequently, an inorganic insulating film, such as a silicon oxide film (thickness: approximately 50 nm to 300 nm) etc., is formed by an CVD method, and thereafter, photolithography, wet etching or dry etching, and resist removal and cleaning are performed with respect to the inorganic insulating film, thereby forming each of the channel protective layers 14, and subsequently, photolithography, wet etching, resist removal and cleaning are performed with respect to the oxide semiconductor film, thereby forming each of the oxide semiconductor layers 13, as shown in FIG. 10(b).

A metal film, such as a titanium film (thickness: approximately 100 nm to 500 nm) etc., is formed by a sputtering method on the entire substrate on which the oxide semiconductor layers 13 have been formed, and thereafter, photolithography, wet etching or dry etching, and resist removal and cleaning are performed with respect to the metal film, thereby forming each of the source lines 15, the source electrodes 15a, and the drain electrodes 15b to form each of the TFTs 5a (see FIG. 10(c)).

Moreover, an inorganic insulating film, such as a silicon oxide film (thickness: approximately 150 nm to 500 nm) etc., is formed by, e.g., a CVD method on the substrate on which the TFTs 5a have been formed, and thereafter, photolithography, dry etching, and resist removal and cleaning are performed with respect to the inorganic insulating film, as shown in FIG. 10(c), thereby forming the protective film 16 in which contact holes C are patterned.

Then, an anneal treatment is performed with respect to the substrate on which the protective film 16 has been formed, thereby recovering oxygen deficiency of the oxide semiconductor layer 13, and reducing a defect level due to the oxygen deficiency.

Finally, a transparent conductive film, such as an ITO film (thickness: approximately 50 nm to 200 nm) etc., is formed by a sputtering method on the entire substrate on which the interlayer insulating film 17 has been formed, and thereafter, photolithography, wet etching, and resist removal and cleaning are performed with respect to the transparent conductive film, thereby forming each of the pixel electrodes 18, as shown in FIG. 10(d).

In this way, the TFT substrate 20d can be fabricated.

As described above, according to the liquid crystal display panel 50d of this embodiment, as well as each of the above embodiments, since the colored layer 21 is provided as an ultraviolet light absorbing layer to overlap the oxide semiconductor layer 13 provided as a channel of the TFT 5a, generation of photocarriers can be reduced without using a black matrix, and since an interlayer insulating film is not provided on the protective film 16, it is possible to reduce a fabrication cost, and shorten a fabrication takt time.

<<Fifth Embodiment of the Invention>>

Figure 11:
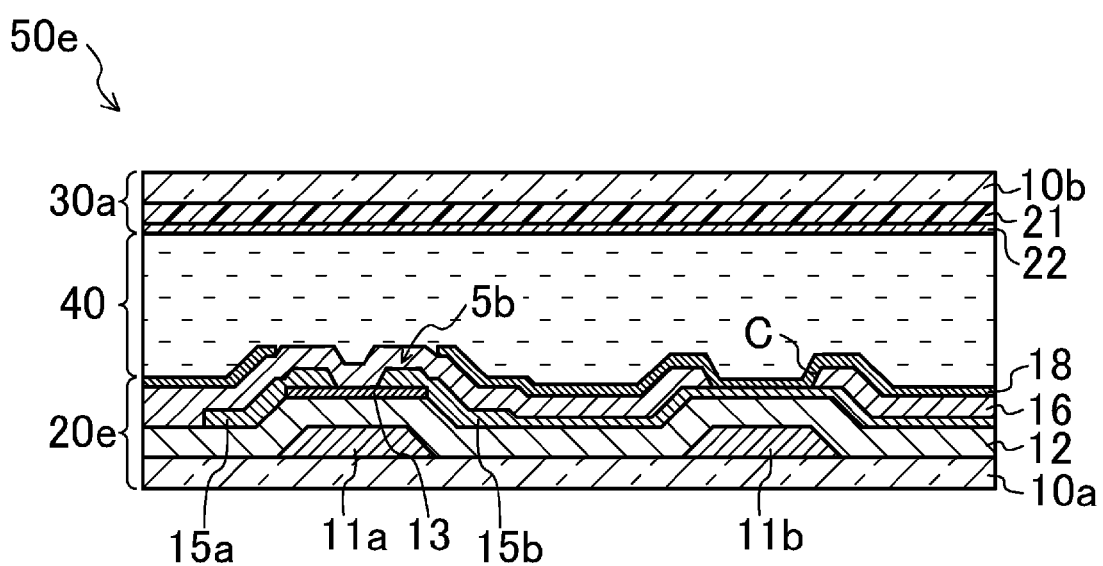
FIG. 11 is a cross-sectional view of a liquid crystal display panel according to a fifth embodiment.

FIG. 11 is a cross-sectional view of a liquid crystal display panel 50e in this embodiment, and FIG. 12 shows cross-sectional views illustrating a method of fabricating a TFT substrate 20e constituting the liquid crystal display panel 50e.

Each of the above embodiments has illustrated the liquid crystal display panels 50a-50d including the TFT substrate in which at least one of the channel protective layer 14 or the interlayer insulating film 17 is provided. This embodiment illustrates the liquid crystal display panel 50e including the TFT substrate 20e in which a channel protective layer and an interlayer insulating film are not provided.

The liquid crystal display panel 50e includes, as shown in FIG. 11, the TFT substrate 20e and a counter substrate 30a provided to face each other, a liquid crystal layer 40 provided between the TFT substrate 20e and the counter substrate 30a, and a frame-shaped sealing material (not shown) provided to bond the TFT substrate 20e and the counter substrate 30a together, and enclose the liquid crystal layer 40 between the TFT substrate 20e and the counter substrate 30a.

As shown in FIG. 11, the TFT substrate 20e includes a protective film 16 to cover each of TFTs 5b, and a plurality of pixel electrodes 18 arranged in a matrix pattern on a protective film 16.

Next, a method of fabricating the TFT substrate 20e in this embodiment will be described with reference to FIG. 12.

Initially, a metal film, such as a titanium film (thickness: approximately 100 nm to 500 nm) etc., is formed by a sputtering method on the entire insulating substrate 10a, such as a glass substrate etc., and thereafter, photolithography, wet etching or dry etching, and resist removal and cleaning are performed with respect to the metal film, thereby forming each of the gate lines 11a and the capacitor lines 11b (see FIG. 12(a)).

Subsequently, an inorganic insulating film, such as a silicon oxide film (thickness: approximately 200 nm to 500 nm) etc., is formed by a CVD (Chemical Vapor Deposition) method on the entire substrate on which the gate lines 11a and the capacitor lines 11b have been formed, thereby forming the gate insulating film 12, as shown in FIG. 12(a).

Moreover, an amorphous oxide semiconductor film (thickness: approximately 20 nm to 200 nm), such as an In—Ga—Zn—O based oxide semiconductor film etc., is formed by a sputtering method on the entire substrate on which the gate insulating film 12 has been formed, and subsequently, photolithography, wet etching, resist removal and cleaning are performed with respect to the oxide semiconductor film, thereby forming each of the oxide semiconductor layers 13, as shown in FIG. 12(b).

A metal film, such as a titanium film (thickness: approximately 100 nm to 500 nm) etc., is formed by a sputtering method on the entire substrate on which the oxide semiconductor layers 13 have been formed, and thereafter, photolithography, wet etching or dry etching, and resist removal and cleaning are performed with respect to the metal film, thereby forming each of the source lines 15, the source electrodes 15a, and the drain electrodes 15b to form each of the TFTs 5b (see FIG. 12(c)).

Moreover, an inorganic insulating film, such as a silicon oxide film (thickness: approximately 150 nm to 500 nm) etc., is formed by, e.g., a CVD method on the substrate on which the TFTs 5b have been formed, and thereafter, photolithography, dry etching, and resist removal and cleaning are performed with respect to the inorganic insulating film, as shown in FIG. 12(c), thereby forming the protective film 16 in which contact holes C are patterned. Then, an anneal treatment is performed with respect to the substrate on which the protective film 16 has been formed, thereby recovering oxygen deficiency of the oxide semiconductor layer 13, and reducing a defect level due to the oxygen deficiency.

Finally, a transparent conductive film, such as an ITO film (thickness: approximately 50 nm to 200 nm) etc., is formed by a sputtering method on the entire substrate on which the protective film 16 has been formed, and thereafter, photolithography, wet etching, and resist removal and cleaning are performed with respect to the transparent conductive film, thereby forming each of the pixel electrodes 18, as shown in FIG. 12(d).

In this way, the TFT substrate 20e can be fabricated.

As described above, according to the liquid crystal display panel 50e of this embodiment, as well as each of the above embodiments, since the colored layer 21 is provided as an ultraviolet light absorbing layer to overlap the oxide semiconductor layer 13 provided as a channel of the TFT 5b, generation of photocarriers can be reduced without using a black matrix, and since a channel protective layer is not provided on the oxide semiconductor layer 13, and an interlayer insulating film is not provided on the protective film 16, it is possible to reduce a fabrication cost, and shorten a fabrication takt time.

<<Sixth Embodiment of the Invention>>

Figure 13:
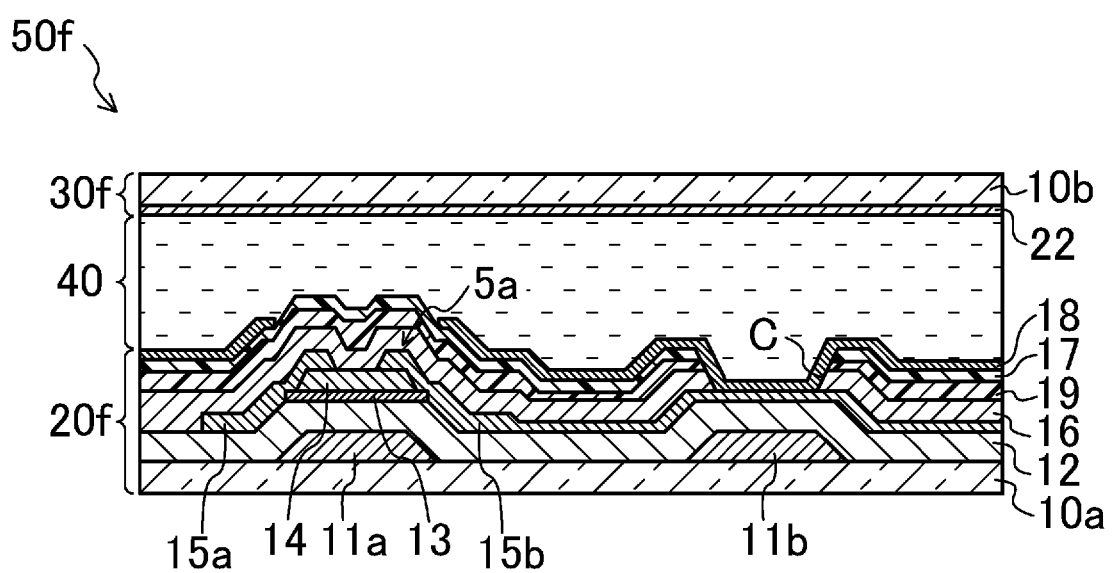
FIG. 13 is a cross-sectional view of a liquid crystal display panel according to a sixth embodiment.

FIG. 13 is a cross-sectional view of a liquid crystal display panel 50f in this embodiment, and FIG. 14 shows cross-sectional views illustrating a method of fabricating a TFT substrate 20f constituting the liquid crystal display panel 50f.

Each of the above embodiments has illustrated the liquid crystal display panels 50a-50e in which the counter substrate 30a includes the colored layer 21. This embodiment illustrates the liquid crystal display panel 50f including the TFT substrate 20f in which a colored layer 19 is provided.

The liquid crystal display panel 50f includes, as shown in FIG. 13, the TFT substrate 20f and a counter substrate 30f provided to face each other, a liquid crystal layer 40 provided between the TFT substrate 20f and the counter substrate 30f, and a frame-shaped sealing material (not shown) provided to bond the TFT substrate 20f and the counter substrate 30f together, and enclose the liquid crystal layer 40 between the TFT substrate 20f and the counter substrate 30f.

As shown in FIG. 13, the TFT substrate 20f includes a protective film 16 to cover each of TFTs 5b, a plurality of the colored layers 19, such as red layers, green layers and blue layers, etc., extending in parallel to each other on the protective film 16, an interlayer insulating film 17 provided on each of the colored layers 19, and a plurality of pixel electrodes 18 arranged in a matrix pattern on the interlayer insulating film 17.

Next, a method of fabricating the liquid crystal display panel 50f in this embodiment will be described with reference to FIG. 14. The fabricating method in this embodiment includes a TFT substrate fabricating process, a counter substrate fabricating process, and a liquid crystal injecting process. The liquid crystal injecting process is substantially the same as that in the first embodiment, and the explanation thereof will be omitted.

<TFT Substrate Fabricating Process>

Initially, a metal film, such as a titanium film (thickness: approximately 100 nm to 500 nm) etc., is formed by a sputtering method on the entire insulating substrate 10a, such as a glass substrate etc., and thereafter, photolithography, wet etching or dry etching, and resist removal and cleaning are performed with respect to the metal film, thereby forming the gate lines 11a and the capacitor lines 11b (see FIG. 14(a)).

Subsequently, an inorganic insulating film, such as a silicon oxide film (thickness: approximately 200 nm to 500 nm) etc., is formed by a CVD (Chemical Vapor Deposition) method on the entire substrate on which the gate lines 11a and the capacitor lines 11b have been formed, thereby forming the gate insulating film 12, as shown in FIG. 14(a).

Moreover, an amorphous oxide semiconductor film (thickness: approximately 20 nm to 200 nm), such as an In—Ga—Zn—O based oxide semiconductor film etc., is formed by a sputtering method on the entire substrate on which the gate insulating film 12 has been formed, and subsequently, an inorganic insulating film, such as a silicon oxide film (thickness: approximately 50 nm to 300 nm) etc., is formed by an CVD method, and thereafter, photolithography, wet etching or dry etching, and resist removal and cleaning are performed with respect to the inorganic insulating film, thereby forming each of the channel protective layers 14, and subsequently, photolithography, wet etching, resist removal and cleaning are performed with respect to the oxide semiconductor film, thereby forming each of the oxide semiconductor layers 13, as shown in FIG. 14(b).

A metal film, such as a titanium film (thickness: approximately 100 nm to 500 nm) etc., is formed by a sputtering method on the entire substrate on which the oxide semiconductor layers 13 have been formed, and thereafter, photolithography, wet etching or dry etching, and resist removal and cleaning are performed with respect to the metal film, thereby forming each of the source lines 15, the source electrodes 15a, and the drain electrodes 15b to form each of the TFTs 5a (see FIG. 14(c)).

Subsequently, an inorganic insulating film, such as a silicon oxide film (thickness: approximately 150 nm to 500 nm) etc., is formed by, e.g., a CVD method on the substrate on which the TFTs 5a have been formed, and thereafter, photolithography, dry etching, and resist removal and cleaning are performed with respect to the inorganic insulating film, as shown in FIG. 14(c), thereby forming the protective film 16 in which contact holes C are patterned. Then, an anneal treatment is performed with respect to the substrate on which the protective film 16 has been formed, thereby recovering oxygen deficiency of the oxide semiconductor layer 13, and reducing a defect level due to the oxygen deficiency.

Moreover, a photosensitive resin colored with, e.g., red, green, or blue is coated by a spin coating method or a slit coating method on the entire insulating substrate 16 has been formed to perform pre-bake, and thereafter, exposure, development, and post-bake are performed with respect to the coated film, thereby forming the colored layer 19 which has the selected color (for example, a red layer) and in which the contact holes C are patterned to have a thickness of approximately 2.0 μm. Subsequently, the similar processes are repeatedly performed with respect to the colored layers having the other two colors, thereby forming the colored layers 19 (for example, a green layer, and a the blue layer) in which the contact holes C are patterned to have a thickness of approximately 2.0 μm (see FIG. 14(d)).

Then, an acrylic photosensitive resin is coated by, e.g., a spin coating method or a slit coating method on the entire substrate on which the colored layers 19 have been formed to have a thickness of approximately 2 μm, and the coated film is patterned by photolithography, thereby forming the interlayer insulating film 17 in which the contact holes C are patterned (see FIG. 14(d)).

Finally, a transparent conductive film, such as an ITO film (thickness: approximately 50 nm to 200 nm) etc., is formed by a sputtering method on the entire substrate on which the interlayer insulating film 17 has been formed, and thereafter, photolithography, wet etching, and resist removal and cleaning are performed with respect to the transparent conductive film, thereby forming each of the pixel electrodes 18, as shown in FIG. 14(d).

In this way, the TFT substrate 20f can be fabricated.

<Counter Substrate Fabricating Process>

A transparent conductive film (thickness: approximately 50 nm to 200 nm), such as an ITO film etc., is formed by a sputtering method on the substrate on which an entire insulating substrate 10b, such as a glass substrate etc., has been formed, and thereafter, photolithography, wet etching and resist removal and cleaning are performed with respect to the transparent conductive film, thereby forming the common electrode 22.

In this way, the counter substrate 30f can be fabricated.

As described above, according to the liquid crystal display panel 50f of this embodiment, as well as each of the above embodiments, since the colored layer 19 is provided as an ultraviolet light absorbing layer to overlap the oxide semiconductor layer 13 provided as a channel of the TFT 5a, generation of photocarriers can be reduced without using a black matrix, and because of the simple structure in which the counter substrate 30f includes only the common electrode 22, it is unnecessary to consider an alignment margin due to a displacement of bonding between the TFT substrate 20f and counter substrate 30f, and it is possible to improve an aperture ratio of a pixel, reduce a fabrication cost, and shorten a fabrication takt time.

<<Seventh Embodiment of the Invention>>

Figure 15:
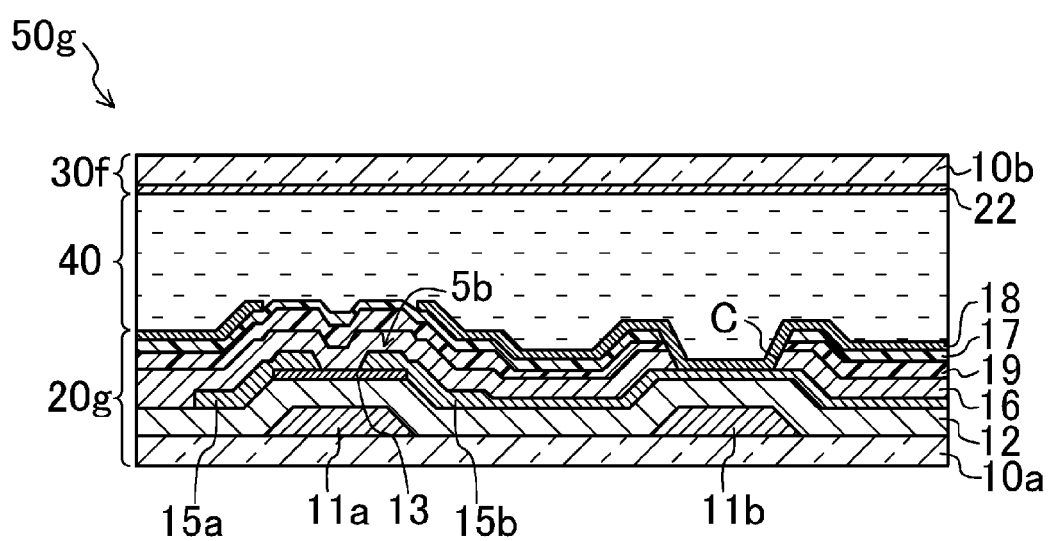
FIG. 15 is a cross-sectional view of a liquid crystal display panel according to a seventh embodiment.

FIG. 15 is a cross-sectional view of a liquid crystal display panel 50g in this embodiment, and FIG. 16 shows cross-sectional views illustrating a method of fabricating a TFT substrate 20g constituting the liquid crystal display panel 50g.

The sixth embodiment has illustrated the liquid crystal display panels 50f including the TFT substrate 20f having a color filter on array structure in which the channel protective layers 14 are provided. This embodiment illustrates the liquid crystal display panel 50g including the TFT substrate 20g having a color filter on array structure in which a channel protective layer is not provided.

The liquid crystal display panel 50g includes, as shown in FIG. 15, the TFT substrate 20g and a counter substrate 30f provided to face each other, a liquid crystal layer 40 provided between the TFT substrate 20g and the counter substrate 30f, and a frame-shaped sealing material (not shown) provided to bond the TFT substrate 20g and the counter substrate 30f together, and enclose the liquid crystal layer 40 between the TFT substrate 20g and the counter substrate 30f.

As shown in FIG. 15, the TFT substrate 20g includes a protective film 16 to cover each of TFTs 5b, a plurality of the colored layers 19, such as red layers, green layers and blue layers, etc., extending in parallel to each other on the protective film 16, an interlayer insulating film 17 on each of the colored layers 19, and a plurality of pixel electrodes 18 arranged in a matrix pattern on the interlayer insulating film 17.

Next, a method of fabricating the TFT substrate 20g in this embodiment will be described with reference to FIG. 16.

Initially, a metal film, such as a titanium film (thickness: approximately 100 nm to 500 nm) etc., is formed by a sputtering method on the entire insulating substrate 10a, such as a glass substrate etc., and thereafter, photolithography, wet etching or dry etching, and resist removal and cleaning are performed with respect to the metal film, thereby forming each of the gate lines 11a and the capacitor lines 11b (see FIG. 16(a)).

Subsequently, an inorganic insulating film, such as a silicon oxide film (thickness: approximately 200 nm to 500 nm) etc., is formed by a CVD (Chemical Vapor Deposition) method on the entire substrate on which the gate lines 11a and the capacitor lines 11b have been formed, thereby forming the gate insulating film 12, as shown in FIG. 16(a).

Moreover, an amorphous oxide semiconductor film (thickness: approximately 20 nm to 200 nm), such as an In—Ga—Zn—O based oxide semiconductor film etc., is formed by a sputtering method on the entire substrate on which the gate insulating film 12 has been formed, and thereafter, photolithography, wet etching, resist removal and cleaning are performed with respect to the oxide semiconductor film, thereby forming each of the oxide semiconductor layers 13, as shown in FIG. 16(b).

A metal film, such as a titanium film (thickness: approximately 100 nm to 500 nm) etc., is formed by a sputtering method on the entire substrate on which the oxide semiconductor layers 13 have been formed, and thereafter, photolithography, wet etching or dry etching, and resist removal and cleaning are performed with respect to the metal film, thereby forming each of the source lines 15, the source electrodes 15a, and the drain electrodes 15b to form each of the TFT 5b (see FIG. 16(c)).

Subsequently, an inorganic insulating film, such as a silicon oxide film (thickness: approximately 150 nm to 500 nm) etc., is formed by, e.g., a CVD method on the substrate on which the TFTs 5b have been formed, and thereafter, photolithography, dry etching, and resist removal and cleaning are performed with respect to the inorganic insulating film, as shown in FIG. 16(c), thereby forming the protective film 16 in which contact holes C are patterned. Then, an anneal treatment is performed with respect to the substrate on which the protective film 16 has been formed, thereby recovering oxygen deficiency of the oxide semiconductor layer 13, and reducing a defect level due to the oxygen deficiency.

Moreover, a photosensitive resin colored with, e.g., red, green, or blue is coated by a spin coating method or a slit coating method on the entire insulating substrate 16 has been formed to perform pre-bake, and thereafter, exposure, development, and post-bake are performed with respect to the coated film, thereby forming the colored layer 19 which has the selected color (for example, a red layer) and in which the contact holes C are patterned to have a thickness of approximately 2.0 μm. Subsequently, the similar processes are repeatedly performed with respect to the colored layers having the other two colors, thereby forming the colored layers 19 (for example, a green layer, a the blue layer) in which the contact holes C are patterned to have a thickness of approximately 2.0 μm (see FIG. 16(d)).

Then, an acrylic photosensitive resin is coated by, e.g., a spin coating method or a slit coating method on the entire substrate on which the colored layers 19 have been formed to have a thickness of approximately 2 μm, and the coated film is patterned by photolithography, thereby forming the interlayer insulating film 17 in which the contact holes C are patterned (see FIG. 16(d)).

Finally, a transparent conductive film, such as an ITO film (thickness: approximately 50 nm to 200 nm) etc., is formed by a sputtering method on the entire substrate on which the interlayer insulating film 17 has been formed, and thereafter, photolithography, wet etching, and resist removal and cleaning are performed with respect to the transparent conductive film, thereby forming each of the pixel electrodes 18, as shown in FIG. 16(d).

In this way, the TFT substrate 20g can be fabricated.

As described above, according to the liquid crystal display panel 50g of this embodiment, as well as the sixth embodiment, since the colored layer 19 is provided as an ultraviolet light absorbing layer to overlap the oxide semiconductor layer 13 provided as a channel of the TFT 5b, generation of photocarriers can be reduced without using a black matrix, and because of the simple structure in which the counter substrate 30f includes only the common electrode 22, it is unnecessary to consider an alignment margin due to a displacement of bonding between the TFT substrate 20g and counter substrate 30f, and it is possible to improve an aperture ratio of a pixel, reduce a fabrication cost, and shorten a fabrication takt time. Besides, since a channel protective layer is not provided on the oxide semiconductor layer 13, it is possible to further reduce a fabrication cost, and shorten a fabrication takt time.

The above embodiments have illustrated a stripe arrangement as an arrangement pattern of color filters. The present invention is also applicable to another arrangement pattern of the color filters, such as a delta pattern, a mosaic pattern, etc.

The above embodiments have illustrated the color filter of RGB three primary colors. The present invention is also applicable to, e.g., a color filter of four or more colors including, in addition to RGB three primary colors, another color, such as a yellow layer (Y) etc., a color filter of C (cyan) M (magenta) Y (yellow) three primary colors, etc.

The above embodiments have illustrated the gate lines, the capacitor lines, and the source lines each having a single structure of Ti. The lines for display, such as gate lines, the capacitor lines, the source lines, etc., may have a single structure of, e.g., Al, Cu, Mo, Ta, W, etc., or a stacked structure of these elements.

The above embodiments have illustrated the gate insulating film, (the channel protective layer), and the protective film each having a single structure of silicon oxide. The gate insulating film, (the channel protective layer), and the protective film may have, e.g., a single structure of silicon nitride or a stacked structure of silicon nitride and silicon oxide.

The first, second, fourth, and sixth embodiment have illustrated the fabricating methods in which the channel protective layers and the oxide semiconductor layers are individually patterned. The channel protective layers and the oxide semiconductor layers may be simultaneously patterned by using, for example, one resist.

The first to third embodiments have illustrated the fabricating methods for forming the protective film by photolithography before forming the interlayer insulating film. The protective film may be formed by using the interlayer insulating film as a resist, for example.

The third to fifth embodiments have illustrated the liquid crystal display panel including the counter substrate of the first embodiment. The liquid crystal display panel may be a liquid crystal display panel including the counter substrate of the second embodiment.

The above embodiments have illustrated the fabricating methods of performing an anneal treatment with respect to the oxide semiconductor layer after resist removal and cleaning. For example, an anneal treatment may be performed after formation of the inorganic insulating film constituting the channel protective layer and the protective film, and moreover, the anneal treatment may be omitted depending on the characteristics of the obtained oxide semiconductor layer.

The above embodiments have illustrated an ITO film as the transparent conductive film constituting the pixel electrodes and the common electrode. The film may be, e.g., an indium zinc oxide (IZO) film etc.

The sixth and seventh embodiments have illustrated the TFT substrate having a color filter on array structure in which the interlayer insulating film is provided. The interlayer insulating film may be omitted.

The above embodiments have illustrated the liquid crystal display panel fabricating method in which, after an empty cell is formed under a normal pressure, a liquid crystal is injected between the substrates of the empty cell by a vacuum injection method.

The present invention is also applicable to a liquid crystal display panel fabricating method in which, for example, one drop fill (ODF) method is used.

The above embodiments have illustrated the fabricating method in which the common electrode is formed by photolithography. The common electrode may be formed by, e.g., a sputtering method using a metal mask.

The above embodiments have illustrated the In—Ga—Zn—O based oxide semiconductor layer. The present invention is also applicable to, for example, In—Si—Zn—O based oxide semiconductor layers, In—Al—Zn—O based oxide semiconductor layers, Sn—Si—Zn—O based oxide semiconductor layers, Sn—Al—Zn—O based oxide semiconductor layers, Sn—Ga—Zn—O based oxide semiconductor layers, Ga—Si—Zn—O based oxide semiconductor layers, Ga—Al—Zn—O based oxide semiconductor layers, In—Cu—Zn—O based oxide semiconductor layers, Sn—Cu—Zn—O based oxide semiconductor layers, Zn—O based oxide semiconductor layers, In—O based oxide semiconductor layers, and In—Zn—O based oxide semiconductor layers, etc.

The above embodiments have illustrated the liquid crystal display panel as a display panel. The present invention is also applicable to other display panels, such as an organic electroluminescence (EL) panel etc.

The above embodiments have illustrated the TFT substrate in which the electrode of the TFT connected to the pixel electrode serves as the drain electrode. The present invention is also applicable to, for example, a TFT substrate in which an electrode of a TFT connected to the pixel electrode is referred to as a source electrode.

Industrial Applicability

As described above, the present invention can reduce generation of photocarriers without using a black matrix, and therefore, is useful for a display panel of an active matrix drive type using TFTs and performing color display.

Description of Reference Characters

P Pixel
5a, 5b TFT
13 Oxide Semiconductor Layer
20a, 20c-20g TFT Substrate
19, 21 Colored Layer (Ultraviolet Light Absorbing Layer)
21R Red Layer (Ultraviolet Light Absorbing Layer)
21G Green Layer (Ultraviolet Light Absorbing Layer)
21B Blue Layer (Ultraviolet Light Absorbing Layer)
30a, 30b, 30f Counter Substrate
40 Liquid Crystal Layer (Display Medium Layer)
50a-50g Liquid Crystal Display Panel

The invention claimed is:

1. A display panel comprising:
a thin film transistor substrate in which a plurality of thin film transistors are provided;
a counter substrate provided to face the thin film transistor substrate; and
a display medium layer provided between the thin film transistor substrate and the counter substrate,
a plurality of pixels being provided so that each of the plurality of pixels is associated with a corresponding one of the thin film transistors, wherein
an oxide semiconductor layer is provided in each of the thin film transistors as a channel,
an ultraviolet light absorbing layer having a light transmitting property is provided in each of the pixels so as to overlap the oxide semiconductor layer,
each of the plurality of pixels has a colored layer colored with one selected from at least three colors of red, green, or blue,
in each of the plurality of pixels having the colored layer colored with the red or the green, the ultraviolet light absorbing layer is part of the colored layer colored with the red or the green, and
in each of the plurality of pixels having the colored layer colored with the blue, the colored layer colored with the blue is not disposed in a portion overlapping the oxide semiconductor layer, and the colored layer colored with the red or the green is disposed in a portion overlapping the oxide semiconductor layer as the ultraviolet light absorbing layer.

2. The display panel of claim 1, wherein the ultraviolet light absorbing layer is provided in the thin film transistor substrate.

3. The display panel of claim 1, wherein the oxide semiconductor layer includes at least one of In, Ga, or Zn.

4. A thin film transistor substrate in which a plurality of the thin film transistors are provided, and a plurality of pixels are provided so that each of the plurality of pixels is associated with a corresponding one of the thin film transistors, wherein
an oxide semiconductor layer is provided in each of the thin film transistors as a channel,
an ultraviolet light absorbing layer having a light transmitting property is provided in each of the pixels so as to overlap the oxide semiconductor layer,
each of the plurality of pixels has a colored layer colored with one selected from at least three colors of red, green, or blue,
in each of the plurality of pixels having the colored layer colored with the red or the green, the ultraviolet light absorbing layer is part of the colored layer colored with the red or the green, and
in each of the plurality of pixels having the colored layer colored with the blue, the colored layer colored with the blue is not disposed in a portion overlapping the oxide semiconductor layer, and the colored layer colored with the red or the green is disposed in a portion overlapping the oxide semiconductor layer as the ultraviolet light absorbing layer.

5. The thin film transistor substrate of claim 4, wherein the oxide semiconductor layer includes at least one of In, Ga, or Zn.

* * * * *